(12) United States Patent
Paik

(10) Patent No.: US 6,910,947 B2
(45) Date of Patent: Jun. 28, 2005

(54) CONTROL OF CHEMICAL MECHANICAL POLISHING PAD CONDITIONER DIRECTIONAL VELOCITY TO IMPROVE PAD LIFE

(75) Inventor: Young Joseph Paik, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 201 days.

(21) Appl. No.: 09/998,372

(22) Filed: Nov. 30, 2001

(65) Prior Publication Data

US 2002/0197934 A1 Dec. 26, 2002

Related U.S. Application Data

(60) Provisional application No. 60/318,743, filed on Sep. 12, 2001, provisional application No. 60/305,798, filed on Jul. 16, 2001, and provisional application No. 60/298,878, filed on Jun. 19, 2001.

(51) Int. Cl.$^7$ ................................................. B24B 7/22
(52) U.S. Cl. ............................. 451/21; 451/5; 451/41; 451/56
(58) Field of Search ........................... 451/21, 5, 8, 41, 451/288, 287, 56

(56) References Cited

U.S. PATENT DOCUMENTS

| | | |
|---|---|---|
| 3,205,485 A | 9/1965 | Noltingk |
| 3,229,198 A | 1/1966 | Libby |
| 4,000,458 A | 12/1976 | Miller et al. |
| 4,207,520 A | 6/1980 | Flora et al. |
| 4,209,744 A | 6/1980 | Gerasimov et al. |
| 4,302,721 A | 11/1981 | Urbanek et al. |
| 4,609,870 A | 9/1986 | Lale et al. |
| 4,698,766 A | 10/1987 | Entwistle et al. |
| 4,750,141 A | 6/1988 | Judell et al. |
| 4,755,753 A | 7/1988 | Chern |

(Continued)

FOREIGN PATENT DOCUMENTS

| | | |
|---|---|---|
| CA | 2050247 | 8/1991 |
| CA | 2165847 | 8/1991 |
| CA | 2194855 | 8/1991 |

(Continued)

OTHER PUBLICATIONS

US 6,150,664, 11/2000, Su (withdrawn)

IslamRaja, M. M., C. Chang, J. P. McVittie, M. A. Cappelli, and K. C. Saraswat. May/Jun. 1993. "Two Precursor Model for Low–Pressure Chemical Vapor Deposition of Silicon Dioxide from Tetraethylorthosilicate." *J. Vac. Sci. Technol. B*, vol. 11, No. 3, pp. 720–726.

Kim, Eui Jung and William N. Gill. Jul. 1994. "Analytical Model for Chemical Vapor Deposition of $SiO_2$ Films Using Tetraethoxysliane and Ozone" (Abstract). *Journal of Crystal Growth*, vol. 140, Issues 3–4, pp. 315–326.

(Continued)

*Primary Examiner*—Robert A. Rose
(74) *Attorney, Agent, or Firm*—Wilmer, Cutler, Pickering, Hale & Dorr

(57) ABSTRACT

A method, apparatus and medium of conditioning a planarizing surface includes installing a wafer to be polished in a chemical mechanical polishing (CMP) apparatus having a polishing pad and a conditioning disk, polishing the wafer under a first set of pad conditioning parameters selected to maintain wafer material removal rates with preselected minimum and maximum removal rates, determining a wafer material removal rate occurring during the polishing step, calculating updated pad conditioning parameters to maintain wafer material removal rates within the maximum and minimum removal rates, and conditioning the polishing pad using the updated pad conditioning parameters, wherein the updated pad conditioning parameters are calculated by a pad wear and conditioning model that predicts the wafer material removal rate of the polishing pad based upon the rotational speed and direction of the conditioning disk.

32 Claims, 13 Drawing Sheets

U.S. PATENT DOCUMENTS

| | | |
|---|---|---|
| 4,757,259 A | 7/1988 | Charpentier |
| 4,796,194 A | 1/1989 | Atherton |
| 4,901,218 A | 2/1990 | Cornwell |
| 4,938,600 A | 7/1990 | Into |
| 4,957,605 A | 9/1990 | Hurwitt et al. |
| 4,967,381 A | 10/1990 | Lane et al. |
| 5,089,970 A | 2/1992 | Lee et al. |
| 5,108,570 A | 4/1992 | Wang |
| 5,208,765 A | 5/1993 | Turnbull |
| 5,220,517 A | 6/1993 | Sierk et al. |
| 5,226,118 A | 7/1993 | Baker et al. |
| 5,231,585 A | 7/1993 | Kobayashi et al. |
| 5,236,868 A | 8/1993 | Nulman |
| 5,240,552 A | 8/1993 | Yu et al. |
| 5,260,868 A | 11/1993 | Gupta et al. |
| 5,270,222 A | 12/1993 | Moslehi |
| 5,283,141 A | 2/1994 | Yoon et al. |
| 5,295,242 A | 3/1994 | Mashruwala et al. |
| 5,309,221 A | 5/1994 | Fischer et al. |
| 5,329,463 A | 7/1994 | Sierk et al. |
| 5,338,630 A | 8/1994 | Yoon et al. |
| 5,367,624 A | 11/1994 | Cooper |
| 5,369,544 A | 11/1994 | Mastrangelo |
| 5,375,064 A | 12/1994 | Bollinger |
| 5,398,336 A | 3/1995 | Tantry et al. |
| 5,402,367 A | 3/1995 | Sullivan et al. |
| 5,408,405 A | 4/1995 | Mozumder et al. |
| 5,410,473 A | 4/1995 | Kaneko et al. |
| 5,420,796 A | 5/1995 | Weling et al. |
| 5,427,878 A | 6/1995 | Corliss |
| 5,444,837 A | 8/1995 | Bomans et al. |
| 5,469,361 A | 11/1995 | Moyne |
| 5,485,082 A | 1/1996 | Wisspeintner et al. |
| 5,490,097 A | 2/1996 | Swenson et al. |
| 5,495,417 A | 2/1996 | Fuduka et al. |
| 5,497,316 A | 3/1996 | Sierk et al. |
| 5,497,381 A | 3/1996 | O'Donoghue et al. |
| 5,503,707 A | 4/1996 | Maung et al. |
| 5,508,947 A | 4/1996 | Sierk et al. |
| 5,511,005 A | 4/1996 | Abbe et al. |
| 5,519,605 A | 5/1996 | Cawlfield |
| 5,525,808 A | 6/1996 | Irie et al. |
| 5,526,293 A | 6/1996 | Mozumder et al. |
| 5,534,289 A | 7/1996 | Bilder et al. |
| 5,541,510 A | 7/1996 | Danielson |
| 5,546,312 A | 8/1996 | Mozumder et al. |
| 5,553,195 A | 9/1996 | Meijer |
| 5,586,039 A | 12/1996 | Hirsch et al. |
| 5,599,423 A | 2/1997 | Parker et al. |
| 5,602,492 A | 2/1997 | Cresswell et al. |
| 5,603,707 A | 2/1997 | Trombetta et al. |
| 5,617,023 A | 4/1997 | Skalski |
| 5,627,083 A | 5/1997 | Tounai |
| 5,629,216 A | 5/1997 | Wijaranakula et al. |
| 5,642,296 A | 6/1997 | Saxena |
| 5,646,870 A | 7/1997 | Krivokapic et al. |
| 5,649,169 A | 7/1997 | Berezin et al. |
| 5,654,903 A | 8/1997 | Reitman et al. |
| 5,657,254 A | 8/1997 | Sierk et al. |
| 5,661,669 A | 8/1997 | Mozumder et al. |
| 5,663,797 A | 9/1997 | Sandhu |
| 5,664,987 A | 9/1997 | Renteln |
| 5,665,199 A | 9/1997 | Sahota et al. |
| 5,665,214 A | 9/1997 | Iturralde |
| 5,666,297 A | 9/1997 | Britt et al. |
| 5,667,424 A | 9/1997 | Pan |
| 5,674,787 A | 10/1997 | Zhao et al. |
| 5,694,325 A | 12/1997 | Fukuda et al. |
| 5,695,810 A | 12/1997 | Dubin et al. |
| 5,698,989 A | 12/1997 | Nulman |
| 5,719,495 A | 2/1998 | Moslehi |
| 5,719,796 A | 2/1998 | Chen |
| 5,735,055 A | 4/1998 | Hochbein et al. |
| 5,740,429 A | 4/1998 | Wang et al. |
| 5,751,582 A | 5/1998 | Saxena et al. |
| 5,754,297 A | 5/1998 | Nulman |
| 5,761,064 A | 6/1998 | La et al. |
| 5,761,065 A | 6/1998 | Kittler et al. |
| 5,764,543 A | 6/1998 | Kennedy |
| 5,777,901 A | 7/1998 | Berezin et al. |
| 5,787,021 A | 7/1998 | Samaha |
| 5,787,269 A | 7/1998 | Hyodo |
| 5,808,303 A | 9/1998 | Schlagheck et al. |
| 5,812,407 A | 9/1998 | Sato et al. |
| 5,824,599 A | 10/1998 | Schacham-Diamand et al. |
| 5,825,356 A | 10/1998 | Habib et al. |
| 5,825,913 A | 10/1998 | Rostami et al. |
| 5,828,778 A | 10/1998 | Hagi et al. |
| 5,831,851 A | 11/1998 | Eastburn et al. |
| 5,832,224 A | 11/1998 | Fehskens et al. |
| 5,838,595 A | 11/1998 | Sullivan et al. |
| 5,838,951 A | 11/1998 | Song |
| 5,844,554 A | 12/1998 | Geller et al. |
| 5,857,258 A | 1/1999 | Penzes et al. |
| 5,859,777 A | 1/1999 | Yokoyama et al. |
| 5,859,964 A | 1/1999 | Wang et al. |
| 5,862,054 A | 1/1999 | Li |
| 5,863,807 A | 1/1999 | Jang et al. |
| 5,867,389 A | 2/1999 | Hamada et al. |
| 5,870,306 A | 2/1999 | Harada |
| 5,871,805 A | 2/1999 | Lemelson |
| 5,883,437 A | 3/1999 | Maruyama et al. |
| 5,889,991 A | 3/1999 | Consolatti et al. |
| 5,901,313 A | 5/1999 | Wolf et al. |
| 5,903,455 A | 5/1999 | Sharpe, Jr. et al. |
| 5,910,011 A | 6/1999 | Cruse |
| 5,910,846 A | 6/1999 | Sandhu |
| 5,912,678 A | 6/1999 | Saxena et al. |
| 5,916,016 A | 6/1999 | Bothra |
| 5,923,553 A | 7/1999 | Yi |
| 5,926,690 A | 7/1999 | Toprac et al. |
| 5,930,138 A | 7/1999 | Lin et al. |
| 5,940,300 A | 8/1999 | Ozaki |
| 5,943,237 A | 8/1999 | Van Boxem |
| 5,943,550 A | 8/1999 | Fulford, Jr. et al. |
| 5,960,185 A | 9/1999 | Nguyen |
| 5,960,214 A | 9/1999 | Sharpe, Jr. et al. |
| 5,961,369 A | 10/1999 | Bartels et al. |
| 5,963,881 A | 10/1999 | Kahn et al. |
| 5,975,994 A | 11/1999 | Sandhu et al. |
| 5,978,751 A | 11/1999 | Pence et al. |
| 5,982,920 A | 11/1999 | Tobin, Jr. et al. |
| 6,002,989 A | 12/1999 | Shiba et al. |
| 6,012,048 A | 1/2000 | Gustin et al. |
| 6,017,771 A | 1/2000 | Yang et al. |
| 6,036,349 A | 3/2000 | Gombar |
| 6,037,664 A | 3/2000 | Zhao et al. |
| 6,041,263 A | 3/2000 | Boston et al. |
| 6,041,270 A | 3/2000 | Steffan et al. |
| 6,054,379 A | 4/2000 | Yau et al. |
| 6,059,636 A * | 5/2000 | Inaba et al. ............... 451/5 |
| 6,064,759 A | 5/2000 | Buckley et al. |
| 6,072,313 A | 6/2000 | Li et al. |
| 6,074,443 A | 6/2000 | Venkatesh et al. |
| 6,077,412 A | 6/2000 | Ting et al. |
| 6,078,845 A | 6/2000 | Friedman |
| 6,094,688 A | 7/2000 | Mellen-Garnett et al. |
| 6,096,649 A | 8/2000 | Jang |
| 6,097,887 A | 8/2000 | Hardikar et al. |
| 6,100,195 A | 8/2000 | Chan et al. |
| 6,108,092 A | 8/2000 | Sandhu |

| | | |
|---|---|---|
| 6,111,634 A | 8/2000 | Pecen et al. |
| 6,112,130 A | 8/2000 | Fukuda et al. |
| 6,113,462 A | 9/2000 | Yang |
| 6,114,238 A | 9/2000 | Liao |
| 6,127,263 A | 10/2000 | Parikh |
| 6,136,163 A | 10/2000 | Cheung et al. |
| 6,141,660 A | 10/2000 | Bach et al. |
| 6,143,646 A | 11/2000 | Wetzel |
| 6,148,099 A | 11/2000 | Lee et al. |
| 6,148,239 A | 11/2000 | Funk et al. |
| 6,148,246 A | 11/2000 | Kawazome |
| 6,150,270 A | 11/2000 | Matsuda et al. |
| 6,157,864 A | 12/2000 | Schwenke et al. |
| 6,159,075 A | 12/2000 | Zhang |
| 6,159,644 A | 12/2000 | Satoh et al. |
| 6,161,054 A | 12/2000 | Rosenthal et al. |
| 6,169,931 B1 | 1/2001 | Runnels |
| 6,172,756 B1 | 1/2001 | Chalmers et al. |
| 6,173,240 B1 | 1/2001 | Sepulveda et al. |
| 6,175,777 B1 | 1/2001 | Kim |
| 6,178,390 B1 | 1/2001 | Jun |
| 6,181,013 B1 | 1/2001 | Liu et al. |
| 6,183,345 B1 | 2/2001 | Kamono et al. |
| 6,185,324 B1 | 2/2001 | Ishihara et al. |
| 6,191,864 B1 | 2/2001 | Sandhu |
| 6,192,291 B1 | 2/2001 | Kwon |
| 6,197,604 B1 | 3/2001 | Miller et al. |
| 6,204,165 B1 | 3/2001 | Ghoshal |
| 6,210,983 B1 | 4/2001 | Atchison et al. |
| 6,211,094 B1 | 4/2001 | Jun et al. |
| 6,212,961 B1 | 4/2001 | Dvir |
| 6,214,734 B1 | 4/2001 | Bothra et al. |
| 6,217,412 B1 | 4/2001 | Campbell et al. |
| 6,222,936 B1 | 4/2001 | Phan et al. |
| 6,226,563 B1 | 5/2001 | Lim |
| 6,226,792 B1 | 5/2001 | Goiffon et al. |
| 6,228,280 B1 | 5/2001 | Li et al. |
| 6,230,069 B1 | 5/2001 | Campbell et al. |
| 6,236,903 B1 | 5/2001 | Kim et al. |
| 6,237,050 B1 | 5/2001 | Kim et al. |
| 6,240,330 B1 | 5/2001 | Kurtzberg et al. |
| 6,240,331 B1 | 5/2001 | Yun |
| 6,245,581 B1 | 6/2001 | Bonser et al. |
| 6,246,972 B1 | 6/2001 | Klimasauskas |
| 6,248,602 B1 | 6/2001 | Bode et al. |
| 6,252,412 B1 | 6/2001 | Talbot et al. |
| 6,253,366 B1 | 6/2001 | Mutschler, III |
| 6,259,160 B1 | 7/2001 | Lopatin et al. |
| 6,263,255 B1 | 7/2001 | Tan et al. |
| 6,268,270 B1 | 7/2001 | Scheid et al. |
| 6,271,670 B1 | 8/2001 | Caffey |
| 6,276,989 B1 | 8/2001 | Campbell et al. |
| 6,277,014 B1 | 8/2001 | Chen et al. |
| 6,280,289 B1 | 8/2001 | Wiswesser et al. |
| 6,281,127 B1 | 8/2001 | Shue |
| 6,284,622 B1 | 9/2001 | Campbell et al. |
| 6,287,879 B1 | 9/2001 | Gonzales et al. |
| 6,290,572 B1 | 9/2001 | Hofmann |
| 6,291,367 B1 | 9/2001 | Kelkar |
| 6,292,708 B1 | 9/2001 | Allen et al. |
| 6,298,274 B1 | 10/2001 | Inoue |
| 6,298,470 B1 | 10/2001 | Breiner et al. |
| 6,303,395 B1 | 10/2001 | Nulman |
| 6,304,999 B1 | 10/2001 | Toprac et al. |
| 6,307,628 B1 | 10/2001 | Lu et al. |
| 6,314,379 B1 | 11/2001 | Hu et al. |
| 6,317,643 B1 | 11/2001 | Dmochowski |
| 6,320,655 B1 | 11/2001 | Matsushita et al. |
| 6,324,481 B1 | 11/2001 | Atchison et al. |
| 6,334,807 B1 | 1/2002 | Lebel et al. |
| 6,336,841 B1 | 1/2002 | Chang |
| 6,339,727 B1 | 1/2002 | Ladd |
| 6,340,602 B1 | 1/2002 | Johnson et al. |
| 6,345,288 B1 | 2/2002 | Reed et al. |
| 6,345,315 B1 | 2/2002 | Mishra |
| 6,346,426 B1 | 2/2002 | Toprac et al. |
| 6,355,559 B1 | 3/2002 | Havemann et al. |
| 6,360,133 B1 | 3/2002 | Campbell et al. |
| 6,360,184 B1 | 3/2002 | Jacquez |
| 6,363,294 B1 | 3/2002 | Coronel et al. |
| 6,366,934 B1 | 4/2002 | Cheng et al. |
| 6,368,879 B1 | 4/2002 | Toprac |
| 6,368,883 B1 | 4/2002 | Bode et al. |
| 6,368,884 B1 | 4/2002 | Goodwin et al. |
| 6,379,980 B1 | 4/2002 | Toprac |
| 6,381,564 B1 | 4/2002 | Davis et al. |
| 6,388,253 B1 | 5/2002 | Su |
| 6,391,780 B1 | 5/2002 | Shih et al. |
| 6,395,152 B1 | 5/2002 | Wang |
| 6,397,114 B1 | 5/2002 | Eryurek et al. |
| 6,400,162 B1 | 6/2002 | Mallory et al. |
| 6,405,096 B1 | 6/2002 | Toprac et al. |
| 6,405,144 B1 | 6/2002 | Toprac et al. |
| 6,417,014 B1 | 7/2002 | Lam et al. |
| 6,427,093 B1 | 7/2002 | Toprac |
| 6,432,728 B1 | 8/2002 | Tai et al. |
| 6,435,952 B1 | 8/2002 | Boyd et al. |
| 6,438,438 B1 | 8/2002 | Takagi et al. |
| 6,440,295 B1 | 8/2002 | Wang |
| 6,442,496 B1 | 8/2002 | Pasadyn et al. |
| 6,449,524 B1 | 9/2002 | Miller et al. |
| 6,455,415 B1 | 9/2002 | Lopatin et al. |
| 6,455,937 B1 | 9/2002 | Cunningham |
| 6,465,263 B1 | 10/2002 | Coss, Jr. et al. |
| 6,470,230 B1 | 10/2002 | Toprac et al. |
| 6,479,902 B1 | 11/2002 | Lopatin et al. |
| 6,479,990 B2 | 11/2002 | Mednikov et al. |
| 6,482,660 B1 | 11/2002 | Conchieri et al. |
| 6,484,064 B1 | 11/2002 | Campbell |
| 6,486,492 B1 | 11/2002 | Su |
| 6,492,281 B1 | 12/2002 | Song et al. |
| 6,495,452 B1 | 12/2002 | Shih |
| 6,503,839 B2 | 1/2003 | Gonzales et al. |
| 6,515,368 B1 | 2/2003 | Lopatin et al. |
| 6,517,413 B1 | 2/2003 | Hu et al. |
| 6,517,414 B1 * | 2/2003 | Tobin et al. .................. 451/8 |
| 6,528,409 B1 | 3/2003 | Lopatin et al. |
| 6,529,789 B1 | 3/2003 | Campbell et al. |
| 6,532,555 B1 | 3/2003 | Miller et al. |
| 6,535,783 B1 | 3/2003 | Miller et al. |
| 6,537,912 B1 | 3/2003 | Agarwal |
| 6,540,591 B1 | 4/2003 | Pasadyn et al. |
| 6,541,401 B1 | 4/2003 | Herner et al. |
| 6,546,508 B1 | 4/2003 | Sonderman et al. |
| 6,556,881 B1 | 4/2003 | Miller |
| 6,560,504 B1 | 5/2003 | Goodwin et al. |
| 6,563,308 B2 | 5/2003 | Nagano et al. |
| 6,567,717 B2 | 5/2003 | Krivokapic et al. |
| 6,580,958 B1 | 6/2003 | Takano |
| 6,587,744 B1 | 7/2003 | Stoddard et al. |
| 6,590,179 B2 | 7/2003 | Tanaka et al. |
| 6,604,012 B1 | 8/2003 | Cho et al. |
| 6,605,549 B2 | 8/2003 | Leu et al. |
| 6,607,976 B2 | 8/2003 | Chen et al. |
| 6,609,946 B1 | 8/2003 | Tran |
| 6,616,513 B1 * | 9/2003 | Osterheld .................. 451/56 |
| 6,618,692 B2 | 9/2003 | Takahashi et al. |
| 6,624,075 B1 | 9/2003 | Lopatin et al. |
| 6,625,497 B2 | 9/2003 | Fairbairn et al. |
| 6,630,741 B1 | 10/2003 | Lopatin et al. |
| 6,640,151 B1 | 10/2003 | Somekh et al. |
| 6,652,355 B2 | 11/2003 | Wiswesser et al. |

| | | | | | |
|---|---|---|---|---|---|
| 6,660,633 B1 | 12/2003 | Lopatin et al. | JP | 8-23166 | 1/1996 |
| 6,678,570 B1 | 1/2004 | Pasadyn et al. | JP | 8-50161 | 2/1996 |
| 6,708,074 B1 | 3/2004 | Chi et al. | JP | 08-149583 | 6/1996 |
| 6,708,075 B2 | 3/2004 | Sonderman et al. | JP | 8-304023 | 11/1996 |
| 6,725,402 B1 | 4/2004 | Coss, Jr. et al. | JP | 09-34535 | 2/1997 |
| 6,728,587 B2 | 4/2004 | Goldman et al. | JP | 9-246547 | 9/1997 |
| 6,735,492 B2 | 5/2004 | Conrad et al. | JP | 10-34522 | 2/1998 |
| 6,751,518 B1 | 6/2004 | Sonderman et al. | JP | 10-173029 | 6/1998 |
| 6,774,998 B1 | 8/2004 | Wright et al. | JP | 11-67853 | 3/1999 |
| 2001/0001755 A1 | 5/2001 | Sandhu et al. | JP | 11-126816 | 5/1999 |
| 2001/0003084 A1 | 6/2001 | Finarov | JP | 11-135601 | 5/1999 |
| 2001/0006873 A1 * | 7/2001 | Moore .................. 451/5 | JP | 2000-183001 | 6/2000 |
| 2001/0030366 A1 | 10/2001 | Nakano et al. | JP | 2001-76982 | 3/2001 |
| 2001/0039462 A1 | 11/2001 | Mendez et al. | JP | 2001-284299 | 10/2001 |
| 2001/0042690 A1 | 11/2001 | Talieh | JP | 2001-305108 | 10/2001 |
| 2001/0044667 A1 | 11/2001 | Nakano et al. | JP | 2002-9030 | 1/2002 |
| 2002/0032499 A1 | 3/2002 | Wilson et al. | JP | 2002-343754 | 11/2002 |
| 2002/0058460 A1 | 5/2002 | Lee et al. | TW | 434103 | 5/2001 |
| 2002/0070126 A1 | 6/2002 | Sato et al. | TW | 436383 | 5/2001 |
| 2002/0077031 A1 | 6/2002 | Johansson et al. | TW | 455938 | 9/2001 |
| 2002/0081951 A1 | 6/2002 | Boyd et al. | TW | 455976 | 9/2001 |
| 2002/0089676 A1 | 7/2002 | Pecen et al. | WO | WO 95/34866 | 12/1995 |
| 2002/0102853 A1 | 8/2002 | Li et al. | WO | WO 98/05066 | 2/1998 |
| 2002/0107599 A1 | 8/2002 | Patel et al. | WO | WO 98/45090 | 10/1998 |
| 2002/0107604 A1 | 8/2002 | Riley et al. | WO | WO 99/09371 | 2/1999 |
| 2002/0113039 A1 | 8/2002 | Mok et al. | WO | WO 99/25520 | 5/1999 |
| 2002/0127950 A1 | 9/2002 | Hirose et al. | WO | WO 99/59200 | 11/1999 |
| 2002/0149359 A1 | 10/2002 | Crouzen et al. | WO | WO 00/00874 | 1/2000 |
| 2002/0165636 A1 | 11/2002 | Hasan | WO | WO 00/05759 | 2/2000 |
| 2002/0183986 A1 | 12/2002 | Stewart et al. | WO | WO 00/35063 | 6/2000 |
| 2002/0185658 A1 | 12/2002 | Inoue et al. | WO | WO 00/54325 | 9/2000 |
| 2002/0193899 A1 | 12/2002 | Shanmugasundram et al. | WO | WO 00/79355 A1 | 12/2000 |
| 2002/0193902 A1 | 12/2002 | Shanmugasundram et al. | WO | WO 01/11679 | 2/2001 |
| 2002/0197745 A1 | 12/2002 | Shanmugasundram et al. | WO | WO 01/18623 | 3/2001 |
| 2002/0197934 A1 | 12/2002 | Paik | WO | WO 01/25865 | 4/2001 |
| 2002/0199082 A1 | 12/2002 | Shanmugasundram et al. | WO | WO 01/33501 A1 | 5/2001 |
| 2003/0017256 A1 | 1/2003 | Shimane | WO | WO 01/52055 A3 | 7/2001 |
| 2003/0020909 A1 | 1/2003 | Adams et al. | WO | WO 01/52319 | 7/2001 |
| 2003/0020928 A1 | 1/2003 | Ritzdorf et al. | WO | WO 01/57823 A2 | 8/2001 |
| 2003/0154062 A1 | 8/2003 | Daft et al. | WO | WO 01/080306 | 10/2001 |
| | | | WO | WO 02/17150 A1 | 2/2002 |
| | | | WO | WO 02/33737 A2 | 4/2002 |
| | | | WO | WO 02/074491 | 9/2002 |

FOREIGN PATENT DOCUMENTS

| | | |
|---|---|---|
| EP | 0 397 924 A1 | 11/1990 |
| EP | 0 621 522 A2 | 10/1994 |
| EP | 0 747 795 A2 | 12/1996 |
| EP | 0 869 652 | 10/1998 |
| EP | 0877308 A2 | 11/1998 |
| EP | 0 881 040 A2 | 12/1998 |
| EP | 0 895 145 A1 | 2/1999 |
| EP | 0 910 123 | 4/1999 |
| EP | 0 932 194 | 7/1999 |
| EP | 0 932 195 A1 | 7/1999 |
| EP | 1 066 925 A2 | 1/2001 |
| EP | 1 071 128 | 1/2001 |
| EP | 1 083 470 A2 | 3/2001 |
| EP | 1 092 505 A2 | 4/2001 |
| EP | 1072967 A3 | 11/2001 |
| EP | 1 182 526 A2 | 2/2002 |
| GB | 2 365 215 A | 2/2002 |
| JP | 61-66104 | 4/1986 |
| JP | 61-171147 | 8/1986 |
| JP | 01-283934 | 11/1989 |
| JP | 3-202710 | 9/1991 |
| JP | 05-151231 | 6/1993 |
| JP | 05-216896 | 8/1993 |
| JP | 05-266029 | 10/1993 |
| JP | 06-110894 | 4/1994 |
| JP | 06-176994 | 6/1994 |
| JP | 6-184434 | 7/1994 |
| JP | 06-252236 | 9/1994 |
| JP | 06-260380 | 9/1994 |

OTHER PUBLICATIONS

Guo, R.S, A. Chen, C.L. Tseng, I.K. Fong, A. Yang, C.L. Lee, C.H. Wu, S. Lin, S.J. Huang, Y.C. Lee, S.G. Chang, and M.Y. Lee. Jun. 16–17, 1998. "A Real–Time Equipment Monitoring and Fault Detection System." *Semiconductor Manufacturing Technology Workshop*, pp. 111–121.

Lantz, Mikkel. 1999. "Equipment and APC Integration at AMD with Workstream." *IEEE*, pp. 325–327.

Jul. 15, 2004. Office Action for U.S. Appl. No. 10/172,977, filed Jun. 18, 2002.

Aug. 2, 2004. Office Action for U.S. Appl. No. 10/174,377, filed Jun. 18, 2002.

Aug. 9, 2004. Written Opinion for PCT Serial No. PCT/US02/19063.

Aug. 18, 2004. International Preliminary Examination Report for PCT Serial No. PCT/US02/19116.

Aug. 24, 2004. Office Action for U.S. Appl. No. 10/135,405, filed May 1, 2002.

Aug. 25, 2004. Office Action for U.S. Appl. No. 09/998,384, filed Nov. 30, 2001.

Sep. 9, 2004. Written Opinion for PCT Serial No. PCT/US02/21942.

Sep. 16, 2004. International Preliminary Examination Report for PCT Serial No. PCT/US02/24859.

Apr. 29, 2004. Written Opinion for PCT/US02/19061.

Sun, S.C. 1998. "CVD and PVD Transition Metal Nitrides as Diffusion Barriers for Cu Metallization." *IEEE*. pp. 243–246.

Tagami, M., A. Furuya, T. Onodera, and Y. Hayashi. 1999. "Layered Ta–nitrides (LTN) Barrier Film by Power Swing Sputtering (PSS) Technique for MOCVD–Cu Damascene Interconnects." *IEEE*. pp. 635–638.

Yamagishi, H., Z. Tokei, G.P. Beyer, R. Donaton, H. Bender, T. Nogami, and K. Maex. 2000. "TEM/SEM Investigation and Electrical Evaluation of a Bottomless I–PVD TA(N) Barrier in Dual Damascene" (Abstract). *Advanced Metallization Conference 2000*. San Diego, CA.

Eisenbraun, Eric, Oscar van der Straten, Yu Zhu, Katharine Dovidenko, and Alain Kaloyeros. 2001. "Atomic Layer Deposition (ALD) of Tantalum–Based Materials for Zero Thickness Copper Barrier Applications" (Abstract). *IEEE*. pp. 207–209.

Smith, S.R., K.E. Elers, T. Jacobs, V. Blaschke, and K. Pfeifer. 2001. "Physical and Electrical Characterization of ALD Tin Used as a Copper Diffusion Barrier in 0.25 mum, Dual Damascene Backend Structures" (Abstract). *Advanced Metallization Conference 2001*. Montreal, Quebec.

Kim, Y.T. and H. Sim. 2002. "Characteristics of Pulse Plasma Enhanced Atomic Layer Deposition of Tungsten Nitride Diffusion Barrier for Copper Interconnect" (Abstract). *IEIC Technical Report*. vol. 102, No. 178, pp. 115–118.

Elers, Kai–Erik, Ville Saanila, Pekka J. Soininen, Wei–Min Li, Juhana T. Kostamo, Suvi Haukka, Jyrki Juhanoja, and Wim F.A. Besling. 2002. "Diffusion Barrier Deposition on a Copper Surface by Atomic Layer Deposition" (Abstract). *Advanced Materials*. vol. 14, No. 13–14, pp. 149–153.

Peng, C.H., C.H. Hsieh, C.L. Huang, J.C. Lin, M.H. Tsai, M.W. Lin, C.L. Chang, Winston S. Shue, and M.S. Liang. 2002. "A 90nm Generation Copper Dual Damascene Technology with ALD TaN Barrier." *IEEE*. pp. 603–606.

Van der Straten, O., Y. Zhu, E. Eisenbraun, and A. Kaloyeros. 2002. "Thermal and Electrical Barrier Performance Testing of Ultrathin Atomic Layer Deposition Tantalum–Based Materials for Nanoscale Copper Metallization." *IEEE*. pp. 188–190.

Wu, Z.C., Y.C. Lu, C.C. Chiang, M.C. Chen, B.T. Chen, G.J. Wang, Y.T. Chen, J.L. Huang, S.M. Jang, and M.S. Liang. 2002. "Advanced Metal Barrier Free Cu Damascene Interconnects with PECVD Silicon Carbide Barriers for 90/65–nm BEOL Technology," *IEEE*. pp. 595–598.

Jul. 25, 2003. International Search Report for PCT/US02/24858.

Mar. 30, 2004. Written Opinion for PCT/US02/19062.

Apr. 9, 2004. Written Opinion for PCT/US02/19116.

Apr. 28, 2004. Written Opinion for PCT/US02/19117.

May 5, 2004. Office Action for U.S. Appl. No. 09/943,955, filed Aug. 31, 2001.

May 5, 2004. International Preliminary Examination Report for PCT/US01/27406.

May 28, 2004. Office Action for U.S. Appl. No. 09/943,383, filed Aug. 31,2001.

Jun. 3, 2004. Office Action for U.S. Appl. No. 09/928,474, filed Aug. 14, 2001.

Jun. 23, 2004. Office Action for U.S. Appl. No. 10/686,589, filed Oct. 17, 2003.

Jun. 30, 2004. Office Action for U.S. Appl. No. 09/800,980, filed Mar. 8, 2001.

Jul. 12, 2004. Office Action for U.S. Appl. No. 10/173,108, filed Jun. 8, 2002.

Miller, G. L., D. A. H. Robinson, and J. D. Wiley. Jul. 1976. "Contactless measurement of semiconductor conductivity by radio frequency–free–carrier power absorption." *Rev. Sci. Instrum.*, vol. 47, No. 7. pp. 799–805.

1999. "Contactless Bulk Resistivity/Sheet Resistance Measurement and Mapping Systems." www.Lehighton.com/fabtech1/index.html.

2000. "Microsense II Capacitance Gaging System." www.a-detech.com.

El Chemali, Chadi et al. Jul./Aug. 2000. "Multizone uniformity control of a chemical mechanical polishing process utilizing a pre– and postmeasurement strategy." *J. Vac. Sci. Technol.* vol. 18, No. 4. pp. 1287–1296.

Mar. 5, 2001. "KLA–Tencor Introduces First Production–worthy Copper CMP In–situ Film Thickness and End–point Control System."http://www.kla–tencor-.com/j/servlet/NewsItem?newsItemID=74.

2002. "Microsense II—5810: Non–Contact Capacitance Gaging Module" www.adetech.com.

Aug. 8, 2003. PCT International Search Report from PCT/US03/08513.

Oct. 14, 2003. PCT International Search Report from PCT/US02/21942.

Oct. 20, 2003. PCT International Search Report from PCT/US02/19116.

Oct. 23, 2003. PCT International Preliminary Examination Report from PCT/US01/24910.

"NanoMapper wafer nanotopography measurement by ADE Phase Shift." http://www.phase–shift.com/nanomap.shtml.

"Wafer flatness measurement of advanced wafers." http://www.phase–shift.com/wafer–flatness.shtml.

"ADE Technologies, Inc.—6360." http://www.adetech.com/6360.shtml.

"3D optical profilometer MicroXAM by ADE Phase Shift." http://www.phase–shift.com/microxam.shtml.

"NanoMapper FA factory automation wafer nanotopography measurement." http://www.phase–shift.com/nanomapper-fa.shtml.

Rocha, Joao and Carlos Ramos. Sep. 12, 1994. "Task Planning for Flexible and Agile Manufacturing Systems."*Intelligent Robots and Systems '94. Advanced Robotic Systems and the Real World, IROS '94. Proceedings of the IEEF/RSJ/GI International Conference on Munich, Germany* Sep. 12–16, 1994. New York, New York: IEEE. pp. 105–112.

Mar. 15, 2002. Office Action for U.S. Appl. No. 09/469,227, filed Dec. 22, 1999.

Mar. 29, 2002. Office Action for U.S. Appl. No. 09/363,966, filed Jul. 29, 1999.

Jun. 20, 2002. Office Action for U.S. Appl. No. 09/619,044, filed Jul. 19, 2000.

Sep. 26, 2002. Office Action for U.S. Appl. No. 09/637,620, filed Aug. 11, 2000.

Oct. 23, 2002. Office Action for U.S. Appl. No. 09/469,227, filed Dec. 22, 1999.

Dec. 17, 2002. Office Action for U.S. Appl. No. 09/363,966, filed Jul. 29, 1999.

Feb. 10, 2003. Office Action for U.S. Appl. No. 09/619,044, filed Jul. 19, 2000.

Apr. 9, 2003. Office Action for U.S. Appl. No. 09/928,474, filed Aug. 14, 2001.

May 8, 2003. Office Action for U.S. Appl. No. 09/637,620, filed Aug. 11,2000.

Jun. 18, 2003. Office Action for U.S. Appl. No. 09/655,542, filed Sep. 6, 2000.

Aug. 8, 2003. International Search Report for PCT/US03/08513.

Aug. 25, 2003. Office Action for U.S. Appl. No. 10/100,184, filed Mar. 19, 2002.

Sep. 15, 2003. Office Action for U.S. Appl. No. 09/928,474, filed Aug. 14, 2001.

Nov. 5, 2003. Office Action for U.S. Appl. No. 10/172,977, filed Jun. 18, 2002.

Dec. 1, 2003. Office Action for U.S. Appl. No. 10/173,108, filed Jun. 18, 2002.

Dec. 11, 2003. Office Action for U.S. Appl. No. 09/943,383, filed Aug. 31, 2001.

Dec. 16, 2003. International Search Report for PCT/US03/23964.

Jan. 20, 2004. Office Action for U.S. Appl. No. 09/927,444, filed Aug. 13, 2001.

Jan. 23, 2004. International Search Report for PCT/US02/24860.

Feb. 2, 2004. Office Action for U.S. Appl. No. 09/363,966, filed Jul. 29, 1999.

Ostanin, Yu.Ya. Oct. 1981. "Optimization of Thickness Inspection of Electrically Conductive Single–Layer Coatings with Laid–on Eddy–Current Transducers (Abstract)." *Defektoskopiya*, vol. 17, No. 10, pp. 45–52. Moscow, USSR.

Feb. 1984. "Substrate Screening Process." *IBM Technical Disclosure Bulletin*, pp. 4824–4825.

Herrmann, D. 1988. "Temperature Errors and Ways of Elimination for Contactless Measurement of Shaft Vibrations (Abstract)." *Technisches Messen™*, vol. 55, No. 1, pp. 27–30. West Germany.

Lin, Kuang–Kuo and Costas J. Spanos. Nov. 1990. "Statistical Equipment Modeling for VLSI Manufacturing: An Application for LPCVD." *IEEE Transactions on Semiconductor Manufacturing*, v. 3, n. 4, pp. 216–229.

Chang, Norman H. and Costas J. Spanos. Feb. 1991. "Continuous Equipment Diagnosis Using Evidence Integration: An LPCVD Application." *IEEE Transactions on Semiconductor Manufacturing*, v. 4, n. 1, pp. 43–51.

Larrabee, G. B. May 1991. "The Intelligent Microelectronics Factory of the Future (Abstract)." *IEEE/SEMI International Semiconductor Manufacturing Science Symposium*, pp. 30–34. Burlingame, CA.

Burke, Peter A. Jun. 1991. "Semi–Empirical Modelling of SiO2 Chemical–Mechanical Polishing Planarization." *VMIC Conference, 1991 IEEE*, pp. 379–384. IEEE.

May 1992. "Laser Ablation Endpoint Detector." *IBM Technical Disclosure Bulletin*, pp. 333–334.

Spanos, Costas J., Hai–Fang Guo, Alan Miller, and Joanne Levine–Parrill. Nov. 1992. "Real–Time Statistical Process Control Using Tool Data." *IEEE Transactions on Semiconductor Manufacturing*, v. 5, n. 4, pp. 308–318.

Feb. 1993. "Electroless Plating Scheme to Hermetically Seal Copper Features." *IBM Technical Disclosure Bulletin*, pp. 405–406.

Scarr, J. M. and J. K. Zelisse. Apr. 1993. "New Topology for Thickness Monitoring Eddy Current Sensors (Abstract)." *Proceedings of the 36th Annual Technical Conference*, Dallas, Texas.

Matsuyama, Akira and Jessi Niou. 1993. "A State–of–the–Art Automation System of an ASIC Wafer Fab in Japan." *IEEE/SEMI International Semiconductor Manufacturing Science Syposium*, pp. 42–47.

Yeh, C. Eugene, John C. Cheng, and Kwan Wong. 1993. "Implementation Challenges of a Feedback Control System for Wafer Fabrication." *IEEE/CHMT International Electronics Manufacturing Technology Symposium*, pp. 438–442.

Kurtzberg, Jerome M. and Menachem Levanoni. Jan. 1994. "ABC: A Better Control for Manufacturing." *IBM Journal of Research and Development*, v. 38, n. 1, pp. 11–30.

Mozumder, Purnendu K. and Gabriel G. Barna. Feb. 1994. "Statistical Feedback Control of a Plasma Etch Process." *IEEE Transactions on Semiconductor Manufacturing*, v. 7, n. 1, pp. 1–11.

Muller–Heinzerling, Thomas, Ulrich Neu, Hans Georg Nurnberg, and Wolfgang May. Mar. 1994. "Recipe–Controlled Operation of Batch Processes with Batch X." *ATP Automatisierungstechnische Praxis*, vol. 36, No. 3, pp. 43–51.

Stoddard, K., P. Crouch, M. Kozicki, and K. Tsakalis. Jun.–Jul. 1994. "Application of Feedforward and Adaptive Feedback Control to Semiconductor Device Manufacturing (Abstract)." *Proceedings of 1994 American Control Conference—ACC '94*, vol. 1, pp. 892–896. Baltimore, Maryland.

Schaper, C. D., M. M. Moslehi, K. C. Saraswat, and T. Kailath. Nov. 1994. "Modeling, Identification, and Control of Rapid Thermal Processing Systems (Abstract)." *Journal of the Electrochemical Society*, vol. 141, No. 11, pp. 3200–3209.

Tao, K. M., R. L. Kosut, M. Ekblad, and G. Aral. Dec. 1994. "Feedforward Learning Applied to RTP of Semiconductor Wafers (Abstract)." *Proceedings of the 33rd IEEE Conference on Decision and Control*, vol. 1, pp. 67–72. Lake Buena Vista, Florida.

Hu, Albert, He Du, Steve Wong, Peter Renteln, and Emmanuel Sachs. 1994. "Application of Run by Run Controller to the Chemical–Mechanical Planarization Process." *IEEE/CPMT International Electronics Manufacturing Technology Symposium*, pp. 371–378.

Spanos, C. J., S. Leang, S.–Y. Ma, J. Thomson, B. Bombay, and X. Niu. May 1995. "A Multistep Supervisory Controller for Photolithographic Operations (Abstract)." *Proceedings of the Symposium on Process Control, Diagnostics, and Modeling in Semiconductor Manufacturing*, pp. 3–17.

Leang, Sovarong, Shang–Yi Ma, John Thomson, Bart John Bombay, and Costas J. Spanos. May 1996. "A Control System for Photolithographic Sequences." *IEEE Transactions on Semiconductor Manufacturing*, vol. 9, No. 2.

Boning, Duane S., William P. Moyne, Taber H. Smith, James Moyne, Ronald Telfeyan, Arnon Hurwitz, Scott Shellman, and John Taylor. Oct. 1996. "Run by Run Control of Chemical–Mechanical Polishing." *IEEE Transactions on Components, Packaging, and Manufacturing Technology—Part C*, vol. 19, no. 4, pp. 307–314.

Zhe, Ning, J. R. Moyne, T. Smith, D. Boning, E. Del Castillo, Yeh Jinn–Yi, and Hurwitz. Nov. 1996. "A Comparative Analysis of Run–to–Run Control Algorithms in Semiconductor Manufacturing Industry (Abstract)." *IEEE/SEMI 1996 Advanced Semiconductor Manufacturing Conference Workshop*, pp. 375–381.

Yasuda, M., T. Osaka, and M. Ikeda. Dec. 1996. "Feedforward Control of a Vibration Isolation System for Disturbance Suppression (Abstract)." *Proceeding of the 35th IEEE Conference on Decision and Control*, vol. 2, pp. 1229–1233. Kobe, Japan.

Fan, Jr–Min, Ruey–Shan Guo, Shi–Chung Chang, and Kian–Huei Lee. 1996. "Abnormal Tred Detection of Sequence–Disordered Data Using EWMA Method." *IEEE/SEMI Advanced Semiconductor Manufacturing Conference*, pp. 169–174.

Smith, Taber and Duane Boning. 1996. "A Self–Tuning EWMA Controller Utilizing Artificial Neural Network Function Approximation Techniques." *IEEE/CPMT International Electronics Manufacturing Technology Symposium*, pp. 355–363.

Guo, Ruey–Shan, Li–Shia Huang, Argon Chen, and Jin–Jung Chen. Oct. 1997. "A Cost–Effective Methodology for a Run–by–Run EWMA Controller." *6th International Symposium on Semiconductor Manufacturing*, pp. 61–64.

Mullins, J. A., W. J. Campbell, and A. D. Stock. Oct. 1997. "An Evaluation of Model Predictive Control in Run–to–Run Processing in Semiconductor Manufacturing (Abstract)." *Proceedings of the SPIE—The International Society for Optical Engineering Conference*, vol. 3213, pp. 182–189.

Reitman, E. A., D. J. Friedman, and E. R. Lory. Nov. 1997. "Pre–Production Results Demonstrating Multiple–System Models for Yield Analysis (Abstract)." *IEEE Transactions on Semiconductor Manufacturing*, vol. 10, No. 4, pp. 469–481.

Durham, Jim and Myriam Roussel. 1997. "A Statistical Method for Correlating In–Line Defectivity to Probe Yield." *IEEE/SEMI Advanced Semiconductor Manufacturing Conference*, pp. 76–77.

Shindo, Wataru, Eric H. Wang, Ram Akella, and Andrzej J. Strojwas. 1997. "Excursion Detection and Source Isolation in Defect Inspection and Classification."*2nd International Workshop on Statistical Metrology*, pp. 90–93.

Jul. 1998. "Active Controller: Utilizing Active Databases for Implementing Multistep Control of Semiconductor Manufacturing (Abstract)." *IEEE Transactions on Components, Packaging and Manufacturing Technology—Part C*, vol. 21, No. 3, pp. 217–224.

Fang, S. J., A. Barda, T. Janecko, W. Little, D. Outley, G. Hempel, S. Joshi, B. Morrison, G. B. Shinn, and M. Birang. 1998. "Control of Dielectric Chemical Mechanical Polishing (CMP) Using and Interferometry Based Endpoint Sensor." *International Proceedings of the IEEE Interconnect Technology Conference*, pp. 76–78.

Ouma, Dennis, Duane Boning, James Chung, Greg Shinn, Leif Olsen, and John Clark. 1998. "An Integrated Characterization and Modeling Methodology for CMP Dielectric Planarization." *Proceedings of the IEEE 1998 International Interconnect Technology Conference*, pp. 67–69.

Boning, Duane S., Jerry Stefani, and Stephanie W. Butler. Feb. 1999. "Statistical Methods for Semiconductor Manufacturing." *Encyclopedia of Electrical Engineering, J. G. Webster, Ed.*

McIntosh, John. Mar. 1999. "Using CD–SEM Metrology in the Manufacture of Semiconductors (Abstract)." *JOM*, vol. 51, No. 3, pp. 38–39.

Pan, J. Tony, Ping Li, Kapila Wijekoon, Stan Tsai, and Fritz Redeker. May 1999. "Copper CMP Integration and Time Dependent Pattern Effect." *IEEE 1999 International Interconnect Technology Conference*, pp. 164–166.

Meckl, P. H. and K. Umemoto. Aug. 1999. "Achieving Fast Motions in Semiconductor Manufacturing Machinery (Abstract)." *Proceedings of the 1999 IEEE International Conference on Control Applications*, vol. 1, pp. 725–729. Kohala Coast, HI.

Khan, K., C. El Chemali, J. Moyne, J. Chapple–Sokol, R. Nadeau, P. Smith, C., and T. Parikh. Oct. 1999. "Yield Improvement at the Contact Process Through Run–to–Run Control (Abstract)." *24th IEEE/CPMT Electronics Manufacturing Technology Symposium*, pp. 258–263.

Ruegsegger, Steven, Aaron Wagner, James S. Freudenberg, and Dennis S. Grimard. Nov. 1999. "Feedforward Control for Reduced Run–to–Run Variation in Microelectronics Manufacturing." *IEEE Transactions on Semiconductor Manufacturing*, vol. 12, No. 4.

November 1999. "How to Use EWMA to Achieve SPC and EPC Control." *International Symposium on NDT Contribution to the Infrastructure Safety Systems*, Tores, Brazil. <http://www.ndt.net/abstract/ndtiss99/data/35.htm>.

Edgar, T. F., W. J. Campbell, and C. Bode. Dec. 1999. "Model–Based Control in Microelectronics Manufacturing." *Proceedings of the 38th IEEE Conference on Decision and Control*, Phoenix, Arizona, vol. 4, pp.4185–4191.

Meckl, P. H. and K. Umemoto. Apr. 2000. "Achieving Fast Motions by Using Shaped Reference Inputs [Semiconductor Manufacturing Machine] (Abstract)." *NEC Research and Development*, vol. 41, No. 2, pp. 232–237.

Oechsner, R., T. Tschaftary, S. Sommer, L. Pfitzner, H. Ryssel, H. Gerath, C. Baier, and M. Hafner. Sep. 2000. "Feed–forward Control for a Lithography/Etch Sequence (Abstract)." *Proceedings of the SPIE—The International Society for Optical Engineering Conference*, vol. 4182, pp. 31–39.

Cheung, Robin. Oct. 18, 2000. "Copper Interconnect Technology." *AVS/CMP User Group Meeting*, Santa Clara, CA.

Edgar, Thomas F., Stephanie W. Butler, W. Jarrett Campbell, Carlos Pfeiffer, Christopher Bode, Sung Bo Hwang, K. S. Balakrishnan, and J. Hahn. Nov. 2000. "Automatic Control in Microelectronics Manufacturing: Practices, Challenges, and Possibilities (Abstract)." *Automatica*, v. 36, n. 11.

Khan, S., M. Musavi, and H. Ressom. Nov. 2000. "Critical Dimension Control in Semiconductor Manufacturing (Abstract)." *ANNIE 2000. Smart Engineering Systems Design Conference*, pp. 995–1000. St. Louis, Missouri.

ACM Research Inc. 2000. "Advanced Copper Metallization for 0.13 to 0.05 $\mu$m & Beyond." <http://acmrc.com/press/ACM–ECP–brochure.pdf>.

Ravid, Avi, Avner Sharon, Amit Weingarten, Vladimir Machavariani, and David Scheiner. 2000. "Copper CMP Planarity Control Using ITM." *IEEE/SEMI Advanced Semiconductor Manufacturing Conference*, pp. 437–443.

Chen, Argon and Ruey–Shan Guo. Feb. 2001. "Age–Based Double EWMA Controller and Its Application to CMP Processes." *IEEE Transactions on Semiconductor Manufacturing*, vol. 14, No. 1, pp. 11–19.

Tobin, K. W., T. P. Karnowski, L. F. Arrowood, and F. Lakhani. Apr. 2001. "Field Test Results of an Automated Image Retrieval System (Abstract)." *Advanced Semiconductor Manufacturing Conference, 2001 IEEE/SEMI*, Munich, Germany.

Tan, K. K., H. F. Dou, and K. Z. Tang. May–Jun. 2001. "Precision Motion Control System for Ultra–Precision Semiconductor and Electronic Components Manufacturing (Abstract)." *51st Electronic Components and Technology Conference 2001. Proceedings*, pp. 1372–1379. Orlando, Florida.

Heuberger, U. Sep. 2001. "Coating Thickness Measurement with Dual–Function Eddy–Current & Magnetic Inductance Instrument (Abstract)."*Galvanotechnik*, vol. 92, No. 9, pp. 2354–2366+IV.

Wang, LiRen and Hefin Rowlands. 2001. "A Novel NN–Fuzzy–SPC Feedback Control System." *8th IEEE International Conference on Emerging Technologies and Factory Automation*, pp. 417–423.

Moyne, J., V. Solakhian, A. Yershov, M. Anderson, and D. Mockler–Hebert. Apr.–May 2002. "Development and Deployment of a Multi–Component Advanced Process Control System for an Epitaxy Tool (Abstract)." *2002 IEEE Advanced Semiconductor Manufacturing Conference and Workshop*, pp. 125–130.

Sarfaty, M., A. Shanmugasundrarn, A. Schwarm, J. Paik, Jimin Zhang, Rong Pan, M. J. Seamons, H. Li, R. Hung, and S. Parikh. Apr.–May 2002. "Advance Process Control Solutions for Semiconductor Manufacturing (Abstract)." *13th Annual IEEE/SEMI Advanced Semiconductor Manufacturing Conference. Advancing the Science and Technology of Semiconductor Manufacturing. ASMC 2002*, pp. 101–106. Boston, MA.

Campbell, W. J., S. K. Firth, A. J. Toprac, and T. F. Edgar. May 2002. "A Comparison of Run–to–Run Control Algorithms (Abstract)." *Proceedings of 2002 American Control Conference*, vol. 3, pp. 2150–2155.

Good, Richard and S. Joe Qin. May 2002. "Stability Analysis of Double EWMA Run–to–Run Control with Metrology Delay." *IEEE/CPMT International Electronics Manufacturing Technology Symposium*, pp. 355–363.

Smith, Stewart, Anthony J. Walton, Alan W. S. Ross, Georg K. H. Bodammer, and J. T. M. Stevenson. May 2002. "Evaluation of Sheet Resistance and Electrical Linewidth Measurement Techniques for Copper Damascene Interconnect." *IEEE Transactions on Semiconductor Manufacturing*, vol. 15, No. 2, pp. 214–222.

Itabashi, Takeyuki, Hiroshi Nakano, and Haruo Akahoshi. Jun. 2002. "Electroless Deposited CoWB for Copper Diffusion Barrier Metal." *IEEE International Interconnect Technology Conference*, pp. 285–287.

ACM Research, Inc. 2002. "ACM Ultra ECP® System: Electro–Copper Plating (ECP) Deposition." www.acmrc.com/ecp.html.

Applied Materials, Inc. 2002. "Applied Materials: Information for Everyone: Copper Electrochemical Plating." www.appliedmaterials.com/products/copper_electrochemical_plating.html.

KLA–Tencor Corporation. 2002. "KLA Tencor: Press Release: KLA–Tencor Introduces First Production–Worthy Copper CMP In–Situ Film Thickness and End–point Control System: Multi–Million Dollar Order Shipped to Major CMP Tool Manufacturer." www.kla–tencor.com/news_events/press_releases/press_releases2001/984086002.html.

Takahashi, Shingo, Kaori Tai, Hiizu Ohtorii, Naoki Komai, Yuji Segawa, Hiroshi Horikoshi, Zenya Yasuda, Hiroshi Yamada, Masao Ishihara, and Takeshi Nogami. 2002. "Fragile Porous Low–k/Copper Integration by Using Electro–Chemical Polishing." *2002 Symposium on VLSI Technology Digest of Technical Papers*, pp. 32–33.

Cunningham, James A. 2003. "Using Electrochemistry to Improve Copper Interconnects." <http://www.e–insite.net/semiconductor/index.asp?layout=article&articleid=CA47465>.

Mar. 25, 2003. International Search Report for PCT/US02/24859 prepared by the European Patent Office.

Adams, Bret W., Bogdan Swedek, Rajeev Bajaj, Fritz Redeker, Manush Birang, and Gregory Amico. "Full–Wafer Endpoint Detection Improves Process Control in Copper CMP." *Semiconductor Fabtech—12th Edition*. Applied Materials. Inc., Santa Clara, CA.

Berman, Mike, Thomas Bibby, and Alan Smith. "Review of In Situ & In–line Detection for CMP Applications." *Semiconductor Fabtech*, 8th Edition, pp. 267–274.

"Semiconductor Manufacturing: An Overview." <http://users.ece.gatech.edu/~gmay/overview.html>.

Hu. Albert, Kevin Nguyen, Steve Wong, Xiuhua Zhang, Emanuel Sachs, and Peter Renteln. 1993. "Concurrent Deployment of Run by Run Controller Using SCC Framework." IEEE/SEMI International Semiconductor Manufacturing Science Symposium. pp. 126–132.

Hu, Albert, He Du, Steve Wong, Peter Renteln, and Emanuel Sachs. 1994. "Application of Run by Run Controller to the Chemical–Mechanical Planarization Process." IEEE/CPMT International Electronics Manufacturing Technology Symposium. pp. 371–378.

Smith, Taber, Duane Boning, James Moyne, Arnon Hurwitz, and John Curry. Jun. 1996. "Compensating for CMP Pad Wear Using Run by Run Feedback Control." Proceedings of the Thirteenth International VLSI Multilevel Interconnection Conference. pp. 437–439.

Suzuki, Junichi and Yoshikazu Yamamoto. 1998. "Toward the Interoperable Software Design Models: Quartet of UML, XML, DOM and CORBA." Proceedings IEEE International Software Engineering Standards Symposium. pp. 1–10.

Klein, Bruce. Jun. 1999. "Application Development: XML Makes Object Models More Useful." Informationweek. pp. 1A–6A.

Chemali, Chadi El, James Moyne, Kareemullah Khan, Rock Nadeau, Paul Smith, John Colt, Jonathan Chapple–Sokol, and Tarun Parikh. Jul./Aug. 2000. "Multizone Uniformity Control of a Chemical Mechanical Polishing Process Utilizing a Pre– and Postmeasurement Strategy." J. Vac. Sci. Technol. A, vol. 18(4). pp. 1287–1296. American Vacuum Society.

Jensen, Alan, Peter Renteln, Stephen Jew, Chris Raeder, and Patrick Cheung. Jun. 2001. "Empirical–Based Modeling for Control of CMP Removal Uniformity." Solid State Technology, vol. 44, No. 6, pp. 101–102, 104, 106. Cowan Publ. Corp.: Washington, D.C.

Sarfaty, Moshe, Arulkumar Shanmugasundram, Alexander Schwarm, Joseph Paik, Jimin Zhang, Rong Pan, Martin J. Seamons, Howard Li, Raymond Hung, and Suketu Parikh. Apr./May 2002. "Advance Process Control Solutions for Semiconductor Manufacturing." IEEE/SEMI Advanced Semiconductor Manufacturing Conference. pp. 101–106.

Oct. 4, 2002. International Search Report from PCT/US01/22833.

Oct. 23, 2002. International Search Report from PCT/US01/27406.

Nov. 7, 2002. International Search Report from PCT/US02/19061.

Nov. 11, 2002. International Search Report from PCT/US02/19117.

Nov. 12. 2002. International Search Report from PCT/US02/19063.

Feb. 1984. "Method and Apparatus of in Situ Measurement and Overlay Error Analysis for Correcting Step and Repeat Lithographic Cameras." *IBM Technical Disclosure Bulletin*, pp. 4855–4859.

Oct. 1984. "Method to Characterize the Stability of a Step and Repeat Lithographic System." *IBM Technical Disclosure Bulletin*, pp. 2857–2860.

Schmid, Hans Albrecht. 1995. "Creating the Architecture of a Manufacturing Framework by Design Patterns." Austin, Texas: OOPSLA.

Baliga, John. Jul. 1999. "Advanced Process Control: Soon to be a Must." Cahners Semiconductor International. www.semiconductor.net/semiconductor/issues/issues/1999/jul99/docs/feature1.asp.

Jul. 5, 2001. "Motorola and Advanced Micro Devices Buy ObjectSpace Catalyst Advanced Process Control Product for Five Wafer Fabs." Semiconductor FABTECH. www.semiconductorfabtech.com/industry.news/9907/20.07.shtml.

Oct. 15, 2001. Search Report prepared by the Austrian Patent Office for Singapore Patent Application No. 200004286–1.

Johnson, Bob. Jun. 10, 2002. "Advanced Process Control Key to Moore's Law." Gartner, Inc.

Jul. 9, 2002. International Search Report prepared by the European Patent Office for PCT/US01/24910.

Jul. 29, 2002. International Search Report prepared by the European Patent Office for PCT/US01/27407.

Sonderman, Thomas. 2002. "APC as a Competitive Manufacturing Technology: AMD's Vision for 300mm." AEC/APC.

Dishon, G., D. Eylon, M. Finarov, and A. Shulman. "Dielectric CMP Advanced Process Control Based on Integrated Monitoring." Ltd. Rehoveth, Israel: Nova Measuring Instruments.

Runyan, W. R., and K. E. Bean. 1990. "Semiconductor Integrated Circuit Processing Technology." p. 48. Reading, Massachusetts: Addison–Wesley Publishing Company.

Zorich, Robert. 1991. *Handbook of Quality Integrated Circuit Manufacturing*. pp. 464–498 San Diego, California: Academic Press, Inc.

Rampalli, Prasad, Arakere Ramesh, and Nimish Shah. 1991. *CEPT—A Computer–Aided Manufacturing Application for Managing Equipment Reliability and Availability in the Semiconductor Industry*. New York, New York: IEEE.

Moyne, James R., Nauman Chaudhry, and Roland Telfeyan. 1995. "Adaptive Extensions to a Multi–Branch Run–to–Run Controller for Plasma Etching." *Journal of Vacuum Science and Technology*. Ann Arbor, Michigan: University of Michigan Display Technology Manufacturing Center.

Moyne, James, Roland Telfeyan, Arnon Hurwitz, and John Taylor. Aug. 1995. "A Process–Independent Run–to–Run Controller and Its Application to Chemical–Mechanical Planarization." *SEMI/IEEE Advanced Semiconductor Manufacturing Conference and Workshop*. Ann Arbor, Michigan: The University of Michigan, Electrical Engineering & Computer Science Center for Display Technology & Manufacturing.

Zhou, Zhen–Hong and Rafael Reif. Aug. 1995. "Epi–Film Thickness Measurements Using Emission Fourier Transform Infrared Spectroscopy—Part II: Real–Time *in Situ* Process Monitoring and Control." IEEE Transactions on Semiconductor Manufacturing, vol. 8, No. 3.

Telfeyan, Roland, James Moyne, Nauman Chaudhry, James Pugmire, Scott Shellman, Duane Boning, William Moyne, Arnon Hurwitz, and John Taylor. Oct. 1995. "A Multi–Level Approach to the Control of a Chemical–Mechanical Planarization Process." Minneapolis, Minnesota: $42^{nd}$ National Symposium of the American Vacuum Society.

Chang, E., B. Stine, T. Maung, R. Divecha, D. Boning, J. Chung, K. Chang, G. Ray, D. Bradbury, O. S. Nakagawa, S. Oh, and D. Bartelink. Dec. 1995. "Using a Statistical Metrology Framework to Identify Systematic and Random Sources of Die– and Wafer–level ILD Thickness Variation in CMP Processes." Washington, D.C.: International Electron Devices Meeting.

Dishon, G., M. Finarov, R. Kipper, J.W. Curry, T. Schraub, D. Trojan, $4^{th}$ Stambaugh, Y. Li and J. Ben–Jacob. Feb. 1996. "On–Line Integrated Metrology for CMP Processing." Santa Clara, California: VMIC Speciality Conferences, $1^{st}$ International CMP Planarization Conference.

Smith, Taber, Duane Boning, James Moyne, Arnon Hurwitz, and John Curry. Jun. 1996. "Compensating for CMP Pad Wear Using Run by Run Feedback Control." Santa Clara, California: VLSI Multilevel Interconnect Conference.

Boning, Duane, William Moyne, Taber Smith, James Moyne, Roland Telfeyan, Arnon Hurwitz, Scott Shellman, and John Taylor. Oct. 1996. "Run by Run Control of Chemical–Mechanical Polishing." *IEEE Trans. CPMT (C)*, vol. 19, No. 4, pp. 307–314.

SEMI. [1986] 1996. "Standard for Definition and Measurement of Equipment Reliability, Availability, and Maintainability (RAM)" SEMI E10–96.

Van Zant, Peter, 1997. *Microchip Fabrication: A Practical Guide to Semiconductor Processing*. Third Edition, pp. 472–478. New York, New York: McGraw–Hill.

Campbell, W. Jarrett, and Anthony J. Toprac. Feb. 11–12, 1998. "Run–to–Run Control in Microelectronics Manufacturing." Advanced Micro Devises, TWMCC.

Edgar, Thomas F., Stephanie W. Butler, Jarrett Campbell, Carlos Pfeiffer, Chris Bode, Sung Bo Hwang, and K.S. Balakrishnan. May 1998. "Automatic Control in Microelectronics Manufacturing: Practices, Challenges, and Possibilities." Automatica, vol. 36, pp. 1567–1603, 2000.

Moyne, James, and John Curry. Jun. 1998. "A Fully Automated Chemical–Mechanical Planarization Process." Santa Clara, California: VLSI Multilevel Interconnection (V–MIC) Conference.

SEMI. Jul. 1998. *New Standard: Provisional Specification for CIM Framework Domain Architecture*. Mountain View, California: SEMI Standards. SEMI Draft Doc. 2817.

Consilium. Aug. 1998. *Quality Management Component: QMC™ and QMC–Link™ Overview*. Mountain View, California: Consilium, Inc.

Chemali, Chadi El, James Moyne, Kareemullah Khan, Rock Nadeau, Paul Smith, John Colt, Jonathan Chapple–Sokol, and Tarun Parikh. Nov. 1998. "Multizone Uniformity Control of a CMP Process Utilizing a Pre and Post–Measurement Strategy." Seattle, Washington: SEMETECH Symposium.

Consilium. 1998. FAB300™. Mountain View, California: Consilium, Inc.

Khan, Kareemullah, Victor Solakhain, Anthony Ricci, Tier Gu, and James Moyne. 1998. "Run–to–Run Control of ITO Deposition Process." Ann Arbor, Michigan.

Consilium. Jan. 1999. "FAB300™: Consilium's Next Generation MES Solution of Software and Services which Control and Automate Real–Time FAB Operations." www.consiliurn.corn/products/fab300_page.htm+FAB300 *Introduction*.

Consilium. Jul. 1999. "Increasing Overall Equipment Effectiveness (OEE) in Fab Manufacturing by Implementing Consilium's Next–Generation Manufacturing Execution System—MES II." Semiconductor Fabtech Edition 10.

Consilium Corporate Brochure. Oct. 1999. www.consilium.com.

Moyne, James. Oct. 1999. "Advancements in CMP Process Automation and Control." Hawaii: (Invited paper and presentation to) Third International Symposium on Chemical Mechanical Polishing in IC Device Manufacturing: 196$^{th}$ Meeting of the Electrochemical Society.

Consilium. Nov. 1999. *FAB300™ Update*.

SEMI. 2000. "Provisional Specification for CIM Framework Scheduling Component." San Jose, California. SEMI E105–1000.

Lee, Brian, Duane S. Boning, Winthrop Baylies, Noel Poduje, Pat Hester, Yong Xia, John Valley, Chris Koliopoulus, Dale Hetherington, HongJiang Sun, and Michael Lacy. Apr. 2001. "Wafer Nanotopography Effects on CMP: Experimental Validation of Modeling Methods." San Francisco, California: Materials Research Society Spring Meeting.

NovaScan 2020. Feb. 2002. "Superior Integrated Process Control for Emerging CMP High–End Applications." .

Williams, Randy, Dadi Gudmundsson, Kevin Monahan, Raman Nurani, Meryl Stoller and J. George Shanthikumar. Oct. 1999. "Optimized Sample Planning for Wafer Defect Inspection," *Semiconductor Manufacturing Conference Proceedings,1999 IEEE International Symposium on Santa Clara, CA*. Piscataway, NJ. pp. 43–46.

Jul. 23, 2003. Invitation to Pay Additional Fees and Communication Relating to the Results of the Partial International Search for PCT/US02/19116.

Aug. 01, 2003. Written Opinion for PCT/US01/27406.

Aug. 20, 2003. Written Opinion for PCT/US01/22833.

Oct. 12, 2004. International Preliminary Examination Report for PCT Serial No. PCT/US02/19061.

Sep. 15, 2004, Office Action for U.S. Appl. No. 10/632,107, filed Aug. 1, 2003.

Sep. 29, 2004. Office Action for U.S. Appl. No. 09/363,966, filed Jul. 29, 1999.

Oct. 1, 2004. International Preliminary Examination Report for PCT Serial No. PCT/US03/23964.

Oct. 6, 2004. Office Action for U.S. Appl. No. 10/759,108, filed Jan. 20, 2004.

Nov. 17, 2004. Written Opinion for PCT Serial No. PCT/US01/27407.

* cited by examiner

CONTROL OF CHEMICAL MECHANICAL POLISHING PAD CONDITIONER DIRECTIONAL VELOCITY TO IMPROVE PAD LIFE

RELATED APPLICATIONS

This application claims priority under 35 U.S.C. §119(e) from now abandoned application Ser. No. 60/298,878 filed Jun. 19, 2001 and entitled "Advanced Process Control for Semiconductor Manufacturing Process."

This application claims priority under 35 U.S.C. §119(e) from now abandoned application Ser. No. 60/305,798, filed Jul. 16, 2001 and entitled "Feedforward and Feedback Control for Conditioning of Chemical Mechanical Polishing Pad."

This application claims priority under 35 U.S.C. §119(e) from now abandoned application Ser. No. 60/318,743, filed Sep. 12, 2001 and entitled "Feedforward and Feedback Control for Conditioning of Chemical Mechanical Polishing Pad."

FIELD OF THE INVENTION

The present invention is generally directed to the area of polishing and methods for improving the life and effectiveness of polishing pads in a chemical mechanical polishing process.

BACKGROUND OF THE INVENTION

Chemical-mechanical polishing (CMP) is used in semiconductor fabrication processes for obtaining full planarization of a semiconductor wafer. The method involves removing material (e.g., a sacrificial layer of surface material) from the wafer, (typically silicon dioxide ($SiO_2$)) using mechanical contact and chemical erosion from, e.g., a moving polishing pad saturated with slurry. Polishing flattens out height differences, since areas of high topography (hills) are removed faster than areas of low topography (valleys). FIG. 1A shows a top view of a CMP machine 100, and FIG. 1B shows a side section view of the CMP machine 100 taken through line AA. The CMP machine 100 is fed wafers to be polished. Typically, the CMP machine 100 picks up a wafer 105 with an arm 101 and places it onto a rotating polishing pad 102. The polishing pad 102 is made of a resilient material and is often textured, to aid the polishing process The polishing pad 102 rotates on a platen 104 or turn table located beneath the polishing pad 102 at a predetermined speed. The wafer 105 is held in place on the polishing pad 102 by the arm 101. The lower surface of the wafer 105 rests against the polishing pad 102. The upper surface of the wafer 105 is against the lower surface of the wafer carrier 106 of arm 101. As the polishing pad 102 rotates, the arm 101 rotates the wafer 105 at a predetermined rate. The arm 101 forces the wafer 105 against the polishing pad 102 with a predetermined amount of down force. The CMP machine 100 also includes a slurry dispense arm 107 extending across the radius of the polishing pad 102. The slurry dispense arm 107 dispenses a flow of slurry onto the polishing pad 102.

Over time the polishing pad loses its roughness and elasticity, and thus, its ability to maintain desired removal rates (polishing rates). It is known that the material removal rate provided by a given polishing pad decreases exponentially with time in the manner shown in FIG. 2. Further the decreased removal rate requires ever-increasing conditioning parameters, e.g., down force and/or conditioning angular velocity and/or conditioning time, in order to restore the desired removal rate of material from the wafer. As a consequence, the polishing pad must be conditioned (e.g., using a conditioning disk 108), between polishing cycles. The conditioning disk is held in place on the polishing pad by arm 109. As the polishing pad rotates, the conditioning disk 108 also rotates. Doing so roughens the surface of the pad and restores, at least temporarily, its original material removal rate. Furthermore, excessive pad conditioning shortens pad life.

A problem with conventional conditioning methods is that they may over-condition, e.g., wear out prematurely, the polishing pad. Each time a pad is replaced, one to several wafers must be polished thereon and the results measured, to ensure that the tool will yield the required polishing. This translates into processing delays and lost tool efficiency.

In an attempt to extend the life of the pad, one may selectively condition portions a polishing pad, or vary the down force of the conditioning element (e.g., conditioning disk 108) along the surface of the CMP pad, based upon the distribution of waste matter across the planarizing surface. Other methods of extending pad life include varying the conditioning recipe across the surface of the polishing pad in response to polishing pad non-uniformities. However, these reported CMP processes are typically more concerned with improving the CMP process, e.g., improving within wafer non-uniformity, than in extending pad life.

Methods and devices that would extend pad life and therefore reduce the frequency of pad replacement offer significant cost savings to the wafer fabrication process.

SUMMARY OF THE INVENTION

The present invention relates to a method, system and medium for conditioning a planarizing surface of a polishing pad in order to extend the working life of the pad. More specifically, at least some embodiments of the present invention use physical and/or chemical models (which can be implemented as a single model or multiple models) of the pad wear and wafer planarization processes to predict polishing pad performance and to extend pad life. This results in an increase in the number of semiconductor wafer or other substrates that can be polished with a single polishing pad, thereby providing significant cost savings in the CMP process, both in extending pad life and reducing the time devoted to pad replacement.

The model predicts polishing effectiveness (wafer material removal rate) based on the "conditioning" operating parameters of the conditioning process. In at least some embodiments of the present invention, operating parameters of conditioning include angular direction and angular velocity of a conditioning disk (where a disk is used to condition) during conditioning, and may also include other factors, such as the frequency of conditioning and time of conditioning. The model selects, and then maintains, polishing pad conditioning parameters within a range that does not overcondition the pad while providing acceptable wafer material removal rates. Thus the present invention provides a process for the feed forward and feed backward control of the CMP polishing process.

In one aspect of the invention, a method of conditioning a planarizing surface in a CMP apparatus having a polishing pad and a conditioning disk includes polishing a wafer in the CMP apparatus under a first set of pad conditioning parameters selected to maintain wafer material removal rates within preselected minimum and maximum removal rates; measuring a wafer material removal rate occurring during said polishing step; calculating, based upon said wafer material removal rate, updated pad conditioning parameters to maintain wafer material removal rates within the maximum and minimum removal rates; and conditioning the polishing pad using the updated pad conditioning parameters. The updated pad conditioning parameters are calculated using a pad wear and pad recovery model by calculating wafer material removal rate as a function of pad conditioning parameters including conditioning disk rotational speed and direction; and determining the difference between the calculated and measured wafer material removal rates and calculating updated pad conditioning parameters to reduce said difference, wherein the updated conditioning parameters are updated according to the equation $k=(k_1)+g^*(k-(k_1))$, where k is a measured parameter, $k_1$ is calculated parameter estimate, g is the estimate gain and $(k-(k_1))$ is the prediction error.

In at least some embodiments of the invention, the first set of pad conditioning parameters are determined empirically, or using historical data, or using the results of the design of experiment (DOE).

In at least some embodiments of the invention, the pad conditioning parameters of the pad wear and pad recovery model further includes frequency of conditioning, or time of conditioning, or translational speed of conditioning disk during conditioning.

In at least some embodiments of the invention, the step of determining the wafer material removal rate includes measuring the wafer thickness before and after polishing.

In at least some embodiments of the invention, the step of calculating updated pad conditioning parameters in step (c) includes executing a recursive optimization process, or in at least some embodiments, includes calculating conditioning parameters such that the parameter is within determined maximum and minimum values.

In at least some embodiments of the present invention, the gain is an indication of variability or reliability in the measured parameter, and the gain is in the range of about 0.5 to 1.0, or gain is in the range of about 0.7 to 0.9.

In at least some embodiments, updated pad conditioning parameters are calculated by determining a difference between an output of the pad wear and pad conditioning model and the wafer material removal step (c). In at least some embodiments, this difference is minimized.

In at least some embodiments of the invention, the steps (b) through (e) are repeated.

In at least some embodiments of the invention, the maximum value for wafer material removal rate is the saturation point of the wafer material removal rate vs. conditioning down force curve, or in at least some embodiments, the maximum value for wafer material removal rate is the initial rate, or in at least some embodiments, the minimum value for wafer material removal rate is defined by the maximum acceptable wafer polishing time.

In at least some embodiments of the invention, the wafer material removal rate is defined by the equation $$RemovalRate]_{min}^{max} = f(\omega_{disk}]_{min}^{max}, f]_{min}^{max}, t_{conditioning}]_{min}^{max}, direction, T_2]_{min}^{max}),$$

where $\omega_{disk}$ is the angular velocity of the conditioning disk during conditioning of the polishing pad, t is the time of conditioning, f is the frequency of condition, direction is the spinning direction of the conditioning disk, and $T_2$ is the sweeping speed of the conditioning disk during conditioning.

In another aspect of the invention, an apparatus for conditioning polishing pads used to planarize substrates includes a carrier assembly having an arm positionable over a planarizing surface of a polishing pad; a conditioning disk attached to the carrier assembly; and an actuator capable of controlling an operating parameter of the conditioning disk; and a controller operatively coupled to the actuator, the controller operating the actuator to adjust the operating parameter of the conditioning disk as a function of a pad wear and pad recovery model that predicts the wafer material removal rate based upon conditioning pad rotational speed and direction.

In at least some embodiments of the invention, the updated pad conditioning parameters are calculated using a pad wear and pad recovery model by calculating wafer material removal rate as a function of pad conditioning parameters including conditioning disk rotational speed and direction; and determining the difference between the calculated and measured wafer material removal rates and calculating updated pad conditioning parameters to reduce said difference, wherein the updated conditioning parameters are updated according to the equation $k=(k_1)+g^*(k-(k_1))$, where k is a measured parameter, $k_1$ is calculated parameter estimate, g is the estimate gain and $(k-(k_1))$ is the prediction error.

In at least some embodiments, the pad conditioning parameters of the pad wear and pad recovery model further includes frequency of conditioning, time of conditioning, or speed of conditioning disk during conditioning.

In at least some other embodiments of the present invention, the gain is an indication of variability or reliability in the measured parameter.

In another aspect of the invention, a method of developing a pad wear and pad conditioning model for optimization of the pad conditioning for polishing pads used to remove material from a wafer, is provided. The method includes:

a) determining the relationship between at least one pad conditioning parameter and wafer material removal rate;

b) determining maximum and minimum values for each of the at least one pad conditioning parameters and the wafer material removal rate; and c) recording the relationships and minimum and maximum values of the at least one pad conditioning parameter and the wafer removal rate.

In at least some embodiments of the invention, the at least one pad conditioning parameter includes a plurality of parameters and the wafer removal rate is defined as a weighted function of the plurality of pad conditioning parameters, or in at least some embodiments, the at least one pad conditioning parameters includes conditioning disk rotational speed, or in at least one embodiment, the at least one pad conditioning parameter further includes conditioning disk rotational direction.

In at least some embodiments of the invention, the at least one pad conditioning parameter includes one or more parameters selected from the group consisting of conditioning disk down force, conditioning disk rotational rate and direction, frequency and duration of conditioning, and conditioning disk translational speed.

In at least some embodiments of the invention, the relationship between the at least one conditioning parameter and wafer removal rate is determined by incrementally varying the conditioning parameter and measuring the resultant wafer removal rate.

In at least some embodiments of the invention, the maximum value for the conditioning parameter is the value above which no incremental increase of the wafer removal rate is observed, or in at least some embodiments, the minimum value for the conditioning parameter is the value which provides the minimum wafer removal rate.

In at least some embodiments of the invention, the invention further includes polishing a wafer in the CMP apparatus under a first set of pad conditioning parameters selected to maintain wafer material removal rates within preselected minimum and maximum removal rates including conditioning disk rotational speed and direction, determining a wafer material removal rate occurring during said polishing step, calculating updated pad conditioning parameters based upon said determined wafer material removal rate and the pad wear and conditioning model to maintain wafer material removal rates within the maximum and minimum removal rates, and conditioning the polishing pad using the updated pad conditioning parameters.

In at least some embodiments of the invention, the updated pad conditioning parameters are calculated by determining the difference between an output of the pad wear and conditioning model and said determined wafer material removal, or in at least some embodiments, the updated pad conditioning parameters are updated according to the equation $k=(k_{,1})+g*(k-(k_1))$, where k is a measured wafer material removal rate, $k_1$ is a calculated wafer material removal rate, g is the estimate gain, and $(k-(k_1))$ is the prediction error.

In another aspect of the invention, a computer readable medium is provided having instructions being executed by a computer, the instructions including a computer-implemented software application for a chemical mechanical polishing process. The instructions for implementing the process include:

a) receiving data from a chemical mechanical polishing tool relating to the wafer removal rate of at least one wafer processed in the chemical mechanical polishing process; and b) calculating, from the data of step (a), updated pad conditioning parameters within defined maximum and minimum values, wherein the updated pad conditioning parameters are calculated by determining the difference between an output of a pad wear and conditioning model and the data of step (a).

In at least some embodiments of the invention, calculating updated conditioning parameters includes calculating parameters such that the parameter is within the determined minimum and maximum values, or in at least some embodiments, calculating updated pad conditioning parameters in step (b) comprises executing a recursive optimization process.

In at least some embodiments of the invention, the maximum value for wafer material removal rate is the saturation point of the wafer material removal rate vs. conditioning down force curve, or in at least some embodiments, the maximum value for wafer material removal rate is the initial rate, or in at least some embodiments, the minimum value for wafer material removal rate is defined by the minimum acceptable wafer polishing time.

In at least some embodiments of the invention, the difference is adjusted using an estimate gain prior to calculating updated pad conditioning parameters.

In another aspect of the invention, a method of conditioning a planarizing surface in a chemical mechanical polishing (CMP) apparatus having a polishing pad against which a wafer is positioned for removal of material therefrom and a conditioning disk is positioned for conditioning of the polishing pad is provided. The method includes:

(a) developing a pad wear and pad conditioning model that defines wafer material removal rate as a function of pad conditioning parameters by:

(i) determining the relationship between at least one pad conditioning parameter and wafer material removal rate;

(ii) determining maximum and minimum values for each of the at least one pad conditioning parameters and the wafer material removal rate;

(iii) recording the relationships and minimum and maximum values of the at least one pad conditioning parameter and the wafer removal rate;

(b) polishing a wafer in the CMP apparatus under a first set of pad conditioning parameters including conditioning disk rotational speed and direction, selected to maintain wafer material removal rates within preselected minimum and maximum removal rates;

(c) determining a wafer material removal rate occurring during said polishing step;

(d) calculating updated pad conditioning parameters based upon said determined wafer material removal rate of said step (b) and the pad wear and conditioning model to maintain wafer material removal rates within the maximum and minimum removal rates, and (f) conditioning the polishing pad using the updated conditioning parameters.

In another aspect of the invention, a system for conditioning a planarizing surface in a chemical mechanical polishing (CMP) apparatus having a polishing pad against which a wafer is positioned for removal of material therefrom and a conditioning disk is positioned for conditioning of the polishing pad includes:

a) a pad wear and conditioning model that defines wafer material removal rate as a function of at least one pad conditioning parameters including rotation and direction of the conditioning disk;

b) polishing means for polishing a wafer in the CMP apparatus c) measuring means for determining a wafer material removal rate; and d) calculating means for updating pad conditioning parameters based upon a wafer material removal rate measured using means of step (c) and the pad wear and conditioning model to maintain wafer material removal rates within the maximum and minimum removal rates.

Thus, polishing pad life is extended by using an appropriate conditioning angular velocity to keep within the acceptable range of wafer material removal rate and reversing direction of conditioning and/or adjusting angular velocity or other conditioning parameters whenever the removal rate drops below the acceptable removal rate. By applying a "one size fits all" approach to pad conditioning parameters, e.g., by determining conditioning parameters without accounting for actual change in wafer material removal rates, conventional processes overcompensate, thereby removing more pad material than is necessary and accelerating pad wear. In contrast, the present invention thus provides improved conditioning parameters by determining only those forces that are minimally necessary to recondition the damaged pad.

BRIEF DESCRIPTION OF THE FIGURES

Various objects, features, and advantages of the present invention can be more fully appreciated with reference to the following detailed description of the invention when considered in connection with the following drawings.

FIG. 1A shows a top plan view of a conventional CMP machine. FIG. 1B shows a side sectional view of the conventional CMP machine from FIG. 1A taken through line A—A.

FIG. 3A is a view of a new polishing pad. FIG. 3B is a view of a polishing pad after a single (or few) conditioning event. FIG. 3C shows an old polishing pad whose surface asperities have been smoothed out by repeated conditioning.

FIG. 4A is a view of a new polishing pad. FIG. 4B is a view of a polishing pad after conditioning in a first angular direction. FIG. 4C shows the same polishing pad after conditioning in the opposite angular direction.

DETAILED DESCRIPTION OF THE INVENTION

Novel methods for feed forward and feed back controls of the CMP process for maximizing the life of the polishing pad are described herein. Extended pad life results in reduced down time for the CMP process because the polishing pad can polish more wafers over a longer period of time without requiring replacement or adjustment (e.g., removal of the damaged portion of the pad). The term wafer is used in a general sense to include any substantially planar object that is subject to polishing. Wafers include, in additional to monolith structures, substrates having one or more layers or thin films or other architecture deposited thereon.

Figure 1A:
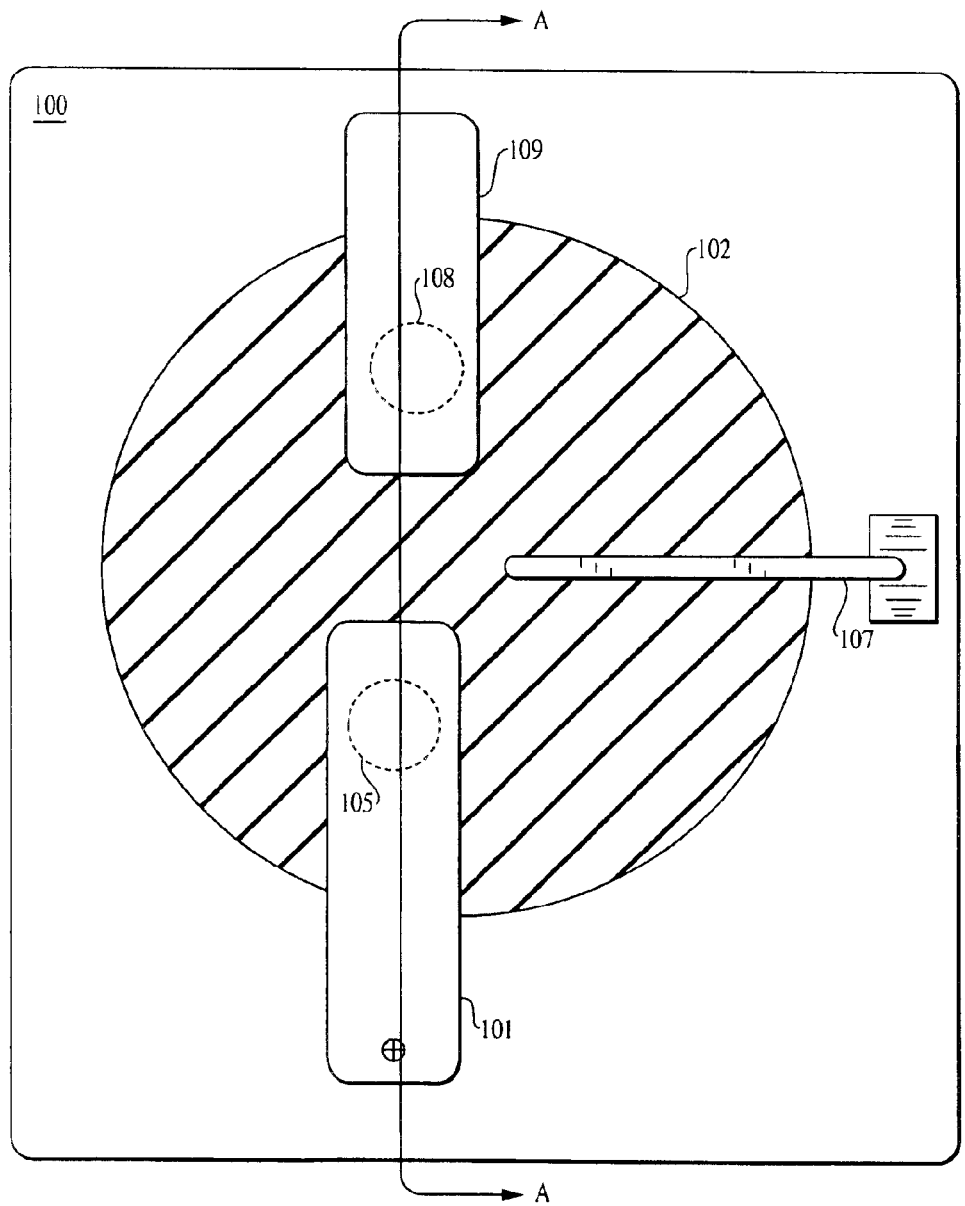
FIGS. 1A–B show a CMP machine
Figure 1B:
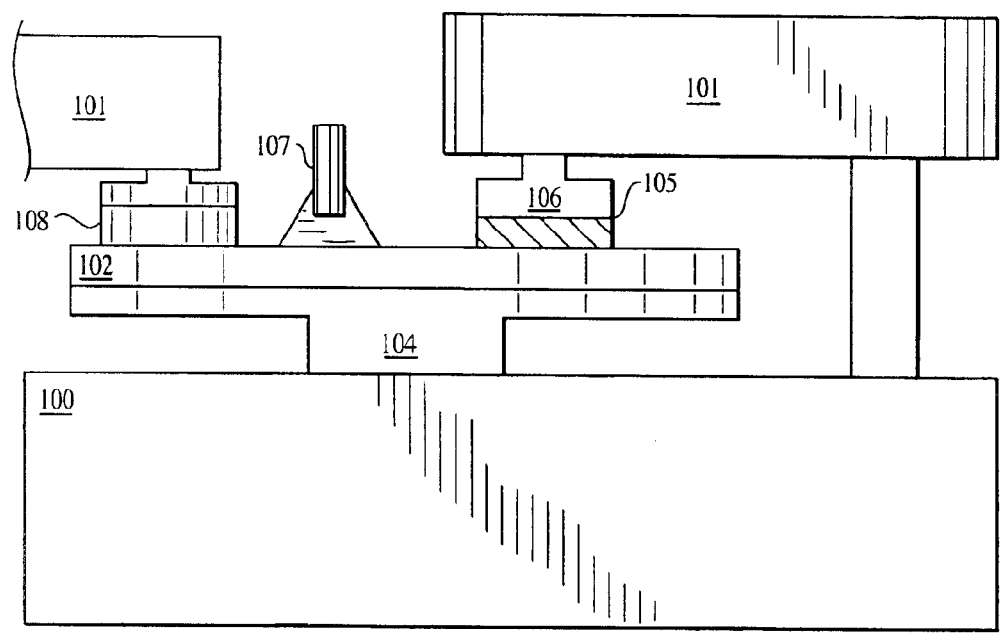
Figure 2:
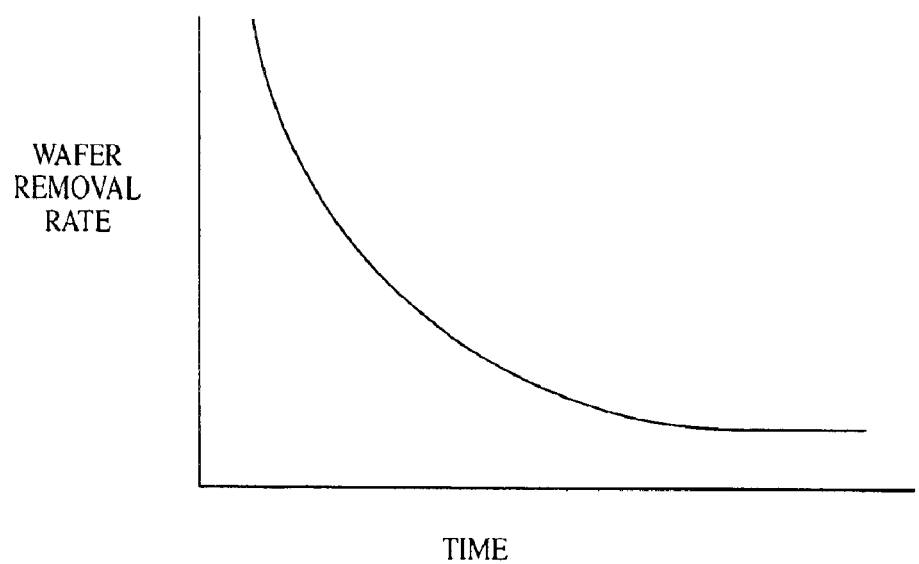
FIG. 2 shows an example exponential decay of wafer material removal rate and the equilibrium state of the removal rate that occurs between FIGS. 3B and 3C.
Figure 3A:
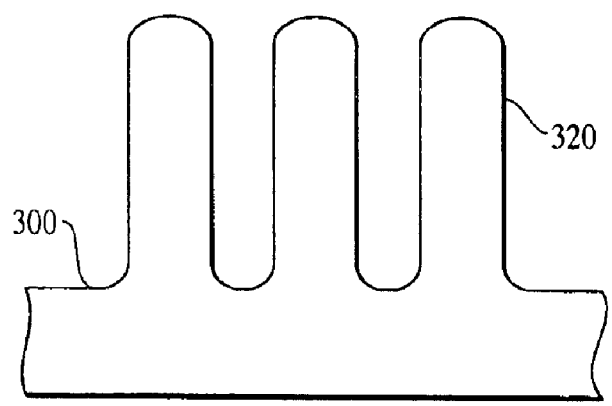
FIGS. 3A–C are cross-sectional views of polishing pads.
Figure 3B:
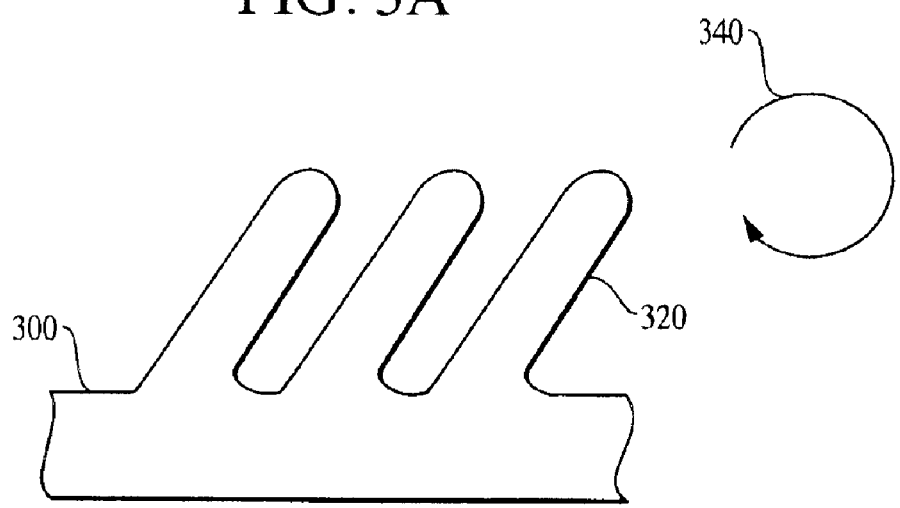
Figure 3C:
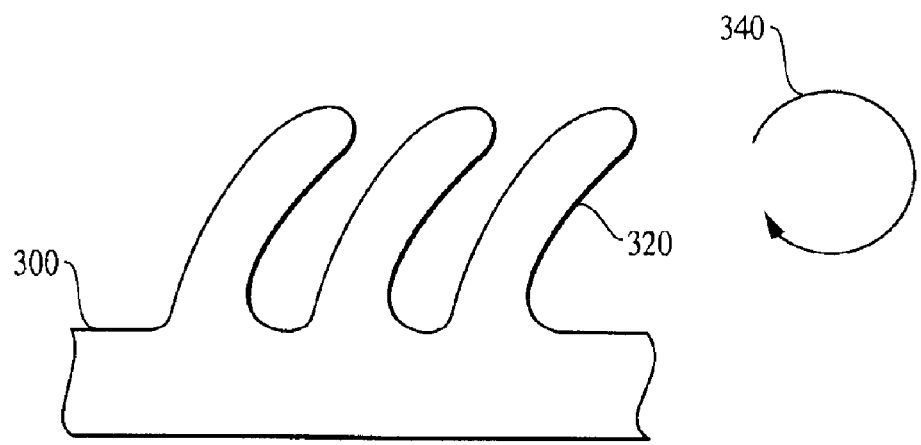

The polishing pad surface needs to maintain a certain level of roughness and elasticity in order to provide the required wafer material removal rates in a CMP process. The roughness and elasticity of the pad decreases with successive wafer polishes, thereby reducing the wafer material removal rate. Initial polishing pad surface conditions (asperities 320) are shown in FIG. 3A, at which time surface roughness is at a maximum. After the pad has been used for polishing, these asperities are pushed down, often in varying directions. To compensate for this, and restore at least some of the roughness of the pad, the pad is conditioned using, for example, a conditioning disk that rotates, for example, in the direction indicated by arrow 340 shown in FIG. 3B. Although the invention is described herein with disk style conditioners, the use of other conditioning mechanisms is specifically contemplated. This, however, introduces a directional bias into the pad surface features 320. Subsequent conditioning operations using the same direction of conditioning may lead to increased directionality in pad surface apserities, thereby blocking the flow of the slurry in the pad and also reducing the contact surface between the pad asperities and the polishing wafer. This is shown by the even greater directional bias of the asperities 320 of FIG. 3C. As a result, wafer material removal rates worsen as directional bias of the pad surface features increases. FIG. 2 shows the decrease in removal rate over time as a result of the conditioning process shown in FIGS. 3A–C.

Figure 4A:
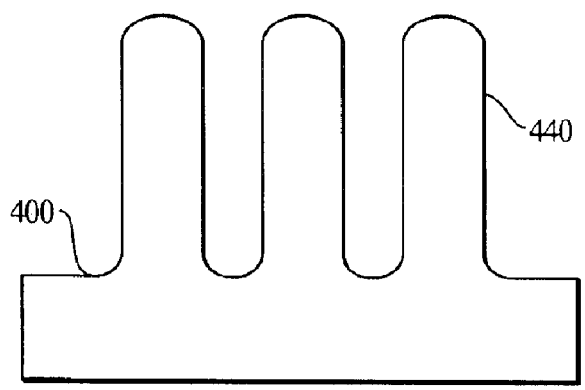
FIGS. 4A–C are cross-sectional views of polishing pads.
Figure 4B:
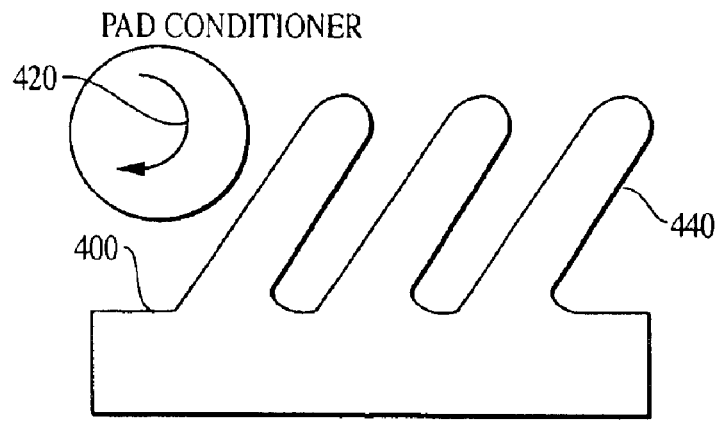
Figure 4C:
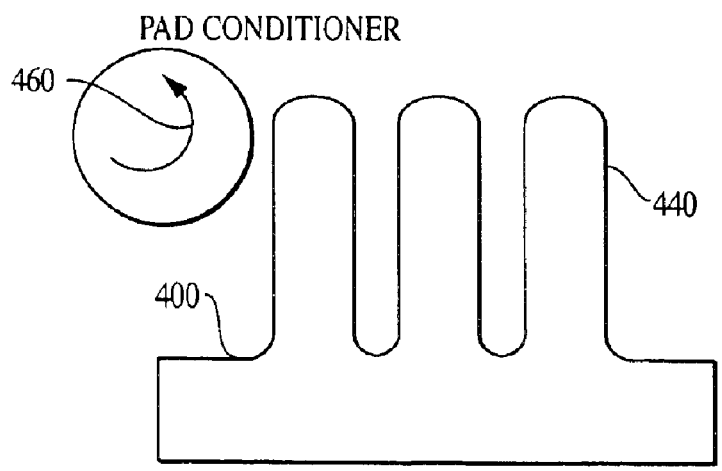

FIGS. 4A, 4B and 4C represent a simplified model used for overcoming the aforementioned bias issue, wherein the angular velocity of the conditioning disk is alternated. Referring first to FIG. 4A, this figure shows initial polishing pad surface conditions. The polishing pad 400 is conditioned by contacting the pad with a conditioning disk at a first angular velocity (e.g., clockwise, indicated by arrow 420 in FIG. 4B), which introduces some directionality to the polishing pad surface features 440. In a subsequent conditioning event, the angular velocity of the conditioning disk is reversed (e.g., counterclockwise, as shown by arrow 460 in FIG. 4C) to "undue" the effect of the previous conditioning events. Alternating the speed and direction of conditioning extends the surface roughness and elasticity. The process shown in FIGS. 4A, 4B and 4C may be repeated for the entire life cycle of the pad until no more active sites are available.

Thus, the polishing pad may be conditioned in a first direction for a predetermined number of times after which the direction of conditioning is reversed. The optimal number of conditioning events in a particular direction is expected to change (decrease) as the pad ages. The model for pad conditioning and recovery adjusts the process accordingly.

The mechanical processes described above during wafer planarization and conditioning of the polishing pad provide a model for optimization of the planarization process. By adjusting pad conditioning parameters according to this model, the pad life can be extended without compromise to the wafer material removal rate. In particular, speed and direction of the conditioning disk, an optionally other operating variables such as conditioning frequency, conditioning duration, and transitional speed of conditioning disk across the pad surface, are adjusted in a feed forward and feed back loop that predicts and then optimizes pad conditioning operating parameters.

Figure 5:
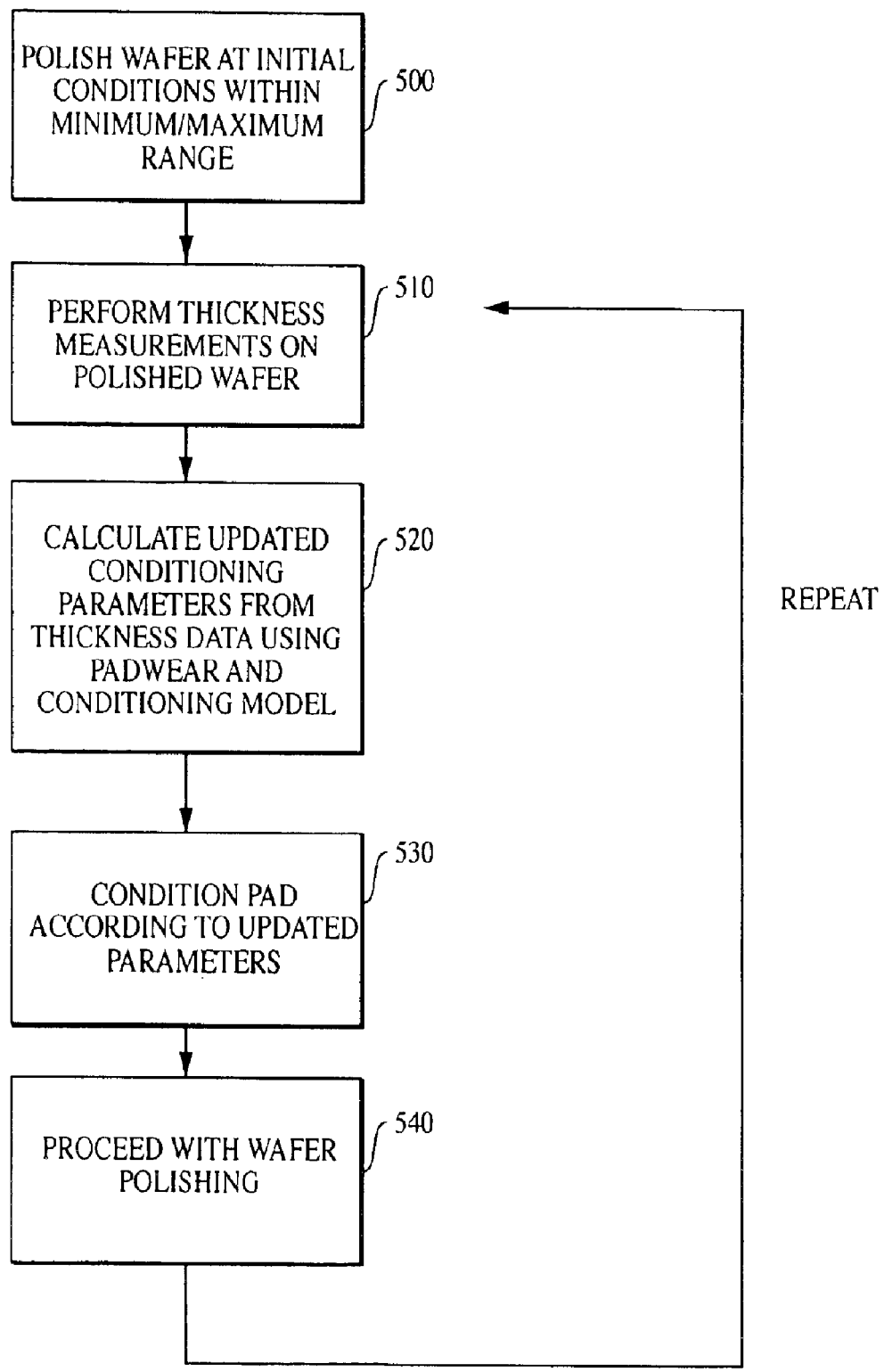
FIG. 5 is a flow diagram of the feedback loop used in at least some embodiments of a CMP process optimization.

According to at least one embodiment of the present invention, an initial model is developed based upon knowledge of the wafer polishing process, and is used in at least some embodiments of the present invention as is shown in FIG. 5. Based on that initial model, e.g., the wafer and polishing pad parameters remain constant, initial processing conditions are identified that will provide a wafer material removal rate between a preselected minimum and maximum value for a given set of conditioning parameters, hereinafter, the "acceptable" range for wafer material removal rates. The conditions are selected to prevent overconditioning of the pad.

Referring now to FIG. 5, wafers are polished according to the initial conditions in step 500. The thicknesses of the polished wafers are measured and a wafer material removal rate is calculated in step 510, which information is then used in a feedback loop to maintain the wafer material removal rate within the accepted range. The actual removal rate is compared with the predicted removal rate (derived from the pad wear model). Deviations, i.e., prediction errors, are used to adjust pad conditioning parameters in step 520 according to the model of the invention to compensate for the reduced polishing capability of the polishing pad as identified in the model and/or to correct for any un-modeled effects. The polishing pad is conditioned according to the updated conditioning parameters in step 530. Polishing is repeated in step 540 and the polishing results are used to further update the polishing conditions by repeating steps 510–530.

By maintaining the wafer material removal rate and conditioning parameters within the preselected minimum and maximum range, overconditioning of the pad is prevented; that is, conditioning parameters may be used that are just sufficient to restore polishing pad effectiveness, but which do not unduly damage the pad. In operation, it may be desirable to select pad conditioning parameters that result in wafer material removal rates that are close to the minimum acceptable rates, as these conditioning forces are less aggressive and therefore are more likely to avoid overconditioning of the polishing pad. However, one should be cautious (or at least cognizant) about operating too closely to the minimum removal rate since a sudden degradation in the pad condition may cause the wafer material removal rate to drop below the minimum acceptable rate.

Pad conditioning optimization is carried out with reference to a specific polishing system. That is, the conditions that improve pad lifetime are specific to the type of wafer being polished, the slurry used in polishing and the composition of the polishing pad. Once a wafer/slurry/polishing pad system is identified, the system is characterized using the models developed and discussed herein. Exemplary polishing pad and wafer parameters include polishing pad size, polishing pad composition, slurry composition, wafer composition, rotational velocity of the polishing pad, polishing pad pressure, and translational velocity of the wafer.

In at least some embodiments of the present invention, it is envisioned that a separate model (or at least a supplement to a composite model) is created for each slurry/polishing pad wafer combination (i.e., for each different type/brand of slurry and each type/brand of pad) that may be used in production with a given type of wafer.

Figure 6:
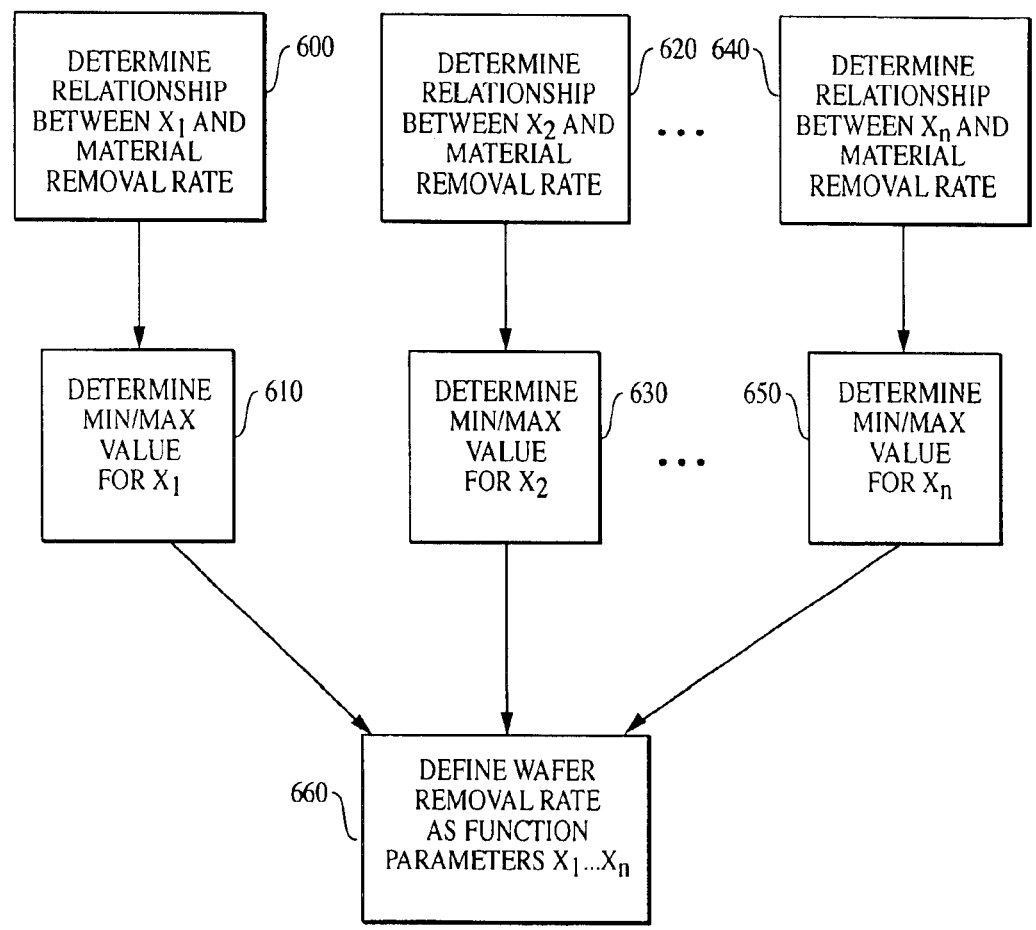
FIG. 6 is a flow diagram illustrating an example of data collection and generation of a pad wear and conditioning model.
Figure 7:
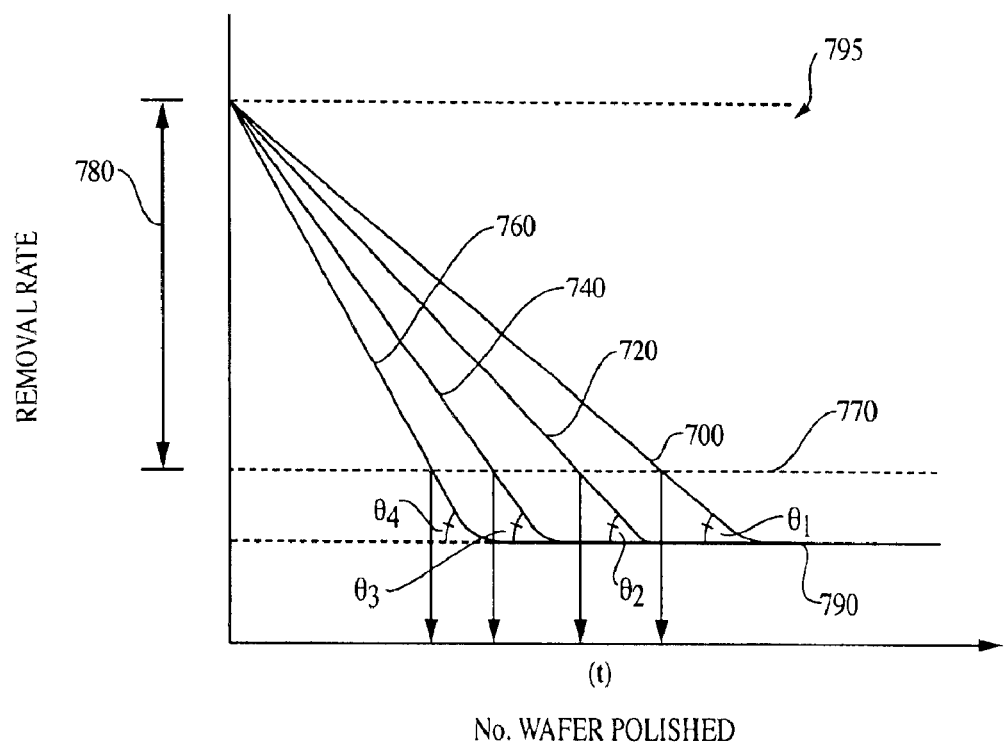
FIG. 7 is a model of polishing pad wear based on FIGS. 3 and 4 used in predicting and optimizing the water removal rate in a CMP process.
Figure 10:
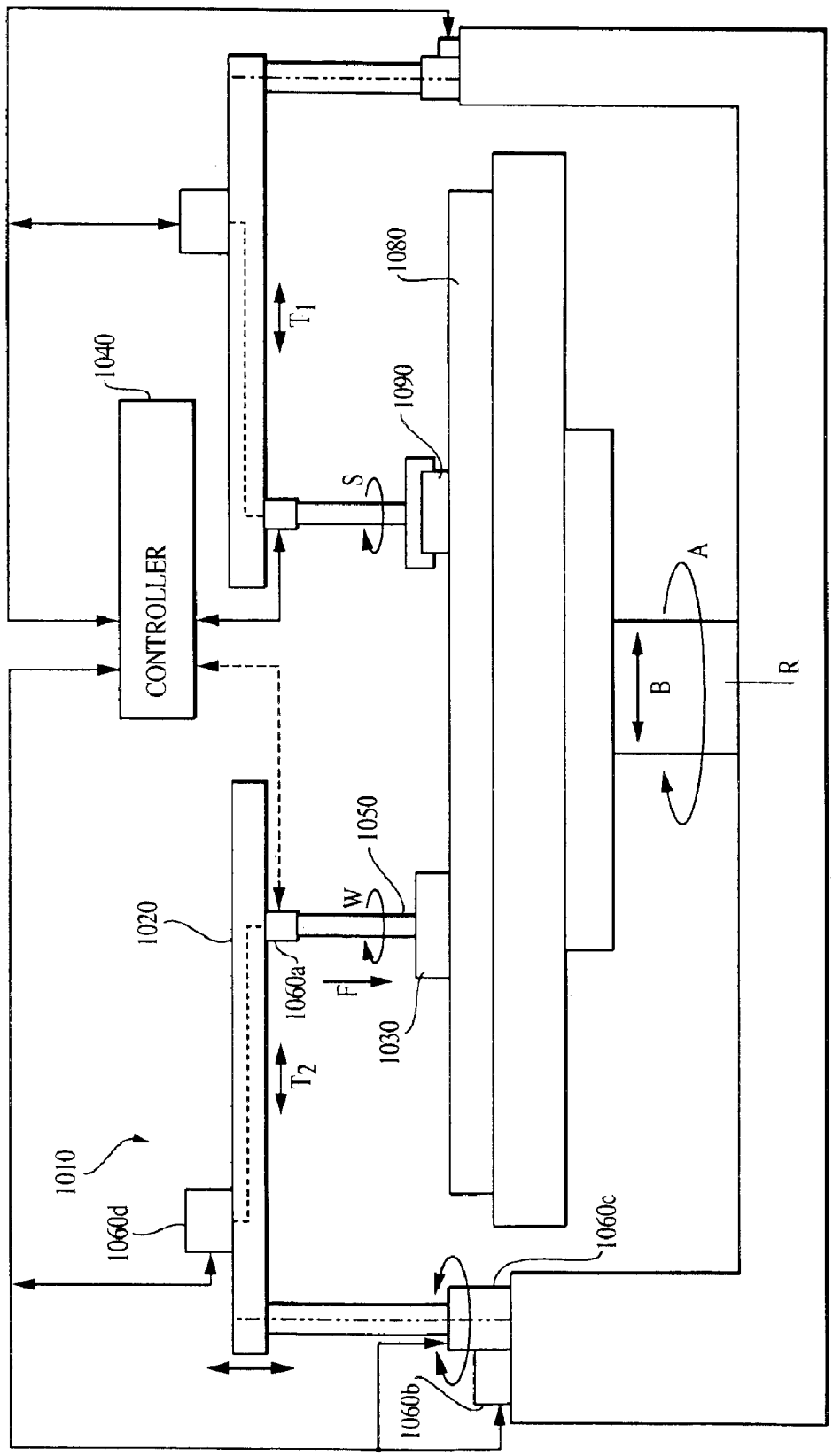
FIG. 10 is a side sectional view of a CMP machine for use in at least some embodiments of the present invention.

FIG. 6 shows a flow diagram of the steps used in the development of the pad wear and conditioning model in at least some embodiments of the invention. In the design of experiment (DOE) in step 600, that is, a set of experiments used to define the model, the relationship between wafer material removal rate and a first conditioning parameter $x_1$, e.g., conditioning disk angular velocity (rpm), is determined using the selected polishing system. The relationship is determined by measuring wafer material removal rates at different conditioning disk angular velocities with wafer parameters such as polishing force, polishing duration, etc., held constant. Thus, a wafer is polished under specified conditions, e.g., for a specified time and at specified polishing pad and wafer speeds, and the rate of material removal is determined. Pad conditioning and wafer polishing (the "polishing event") may be carried out simultaneously, i.e., using an apparatus such as shown in FIG. 10, or pad conditioning may be followed by wafer polishing. The conditioning disk velocity is increased incrementally from wafer to wafer (or thickness measurement to thickness measurement) with all other parameters held constant, and the wafer removal rate is again determined. A curve as shown in FIG. 7 may be generated, which illustrates the effect of the conditioning disk velocity on the wafer's material removal rate for a given polishing system (all other parameters being held constant). The curve is represented as a linear curve over the removal rate of interest, but may, in at least some embodiment of the invention, be a non-linear, e.g. quadratic or exponential curve.

In step 610 of FIG. 6, as contemplated by at least some of the embodiments of the invention, minimum and maximum values for the conditioning parameter are determined. With reference to FIG. 7, a curve 700 represents the change in wafer material removal rate with time (as determined by number of wafers polished) for a given set of operating parameters. The removal rate is represented as decreasing linearly with time until an equilibrium rate is achieved, which may be, but is not required to be, less than the minimum removal rate 770, which is determined by the operator, for example, based upon production needs. The slope of the curve is characterized by the angle $\theta_1$. The curve can be, in at least some of embodiments, linear or non-linear, e.g. exponential or quadratic, or the like. The minimum wafer material removal rate is dictated by production goals, since a minimal wafer throughput rate is needed. The maximum wafer material removal rate 795 is defined as the initial removal rate.

Successive curves 720, 740, 760 may also be generated for different conditioning disk velocities (here increasing velocities are shown). The removal rate range 780 defines the removal rate maximum and minimum for the model, where the maximum removal rate is the initial removal rate and the minimum removal rate is production determined. Intersection of curves 700, 720, 740, 760 with the minimum removal rate defines the upper limit of wafers that can be polished under the defined pad conditioning parameters. The angles $\theta_1, \theta_2, \theta_3,$ and $\theta_4$ are defined by the intersection of the equilibrium curve 790 with curves 700, 720, 740, 760, respectively. The values for $\theta$ are descriptive of the response of the polishing process to conditioning parameters. The larger the value for $\theta$, the steeper the slope of the curve and the more sensitive the planarization process is to conditioning parameters.

In step 620, as contemplated by at least some embodiments of the present invention, the relationship between wafer material removal rate and a second conditioning parameter, e.g., direction of pad conditioning, is determined in the same polishing system. In step 630, $x_2$, maximum and minimum values for the second conditioning parameter and wafer material removal rates is determined.

Figure 8:
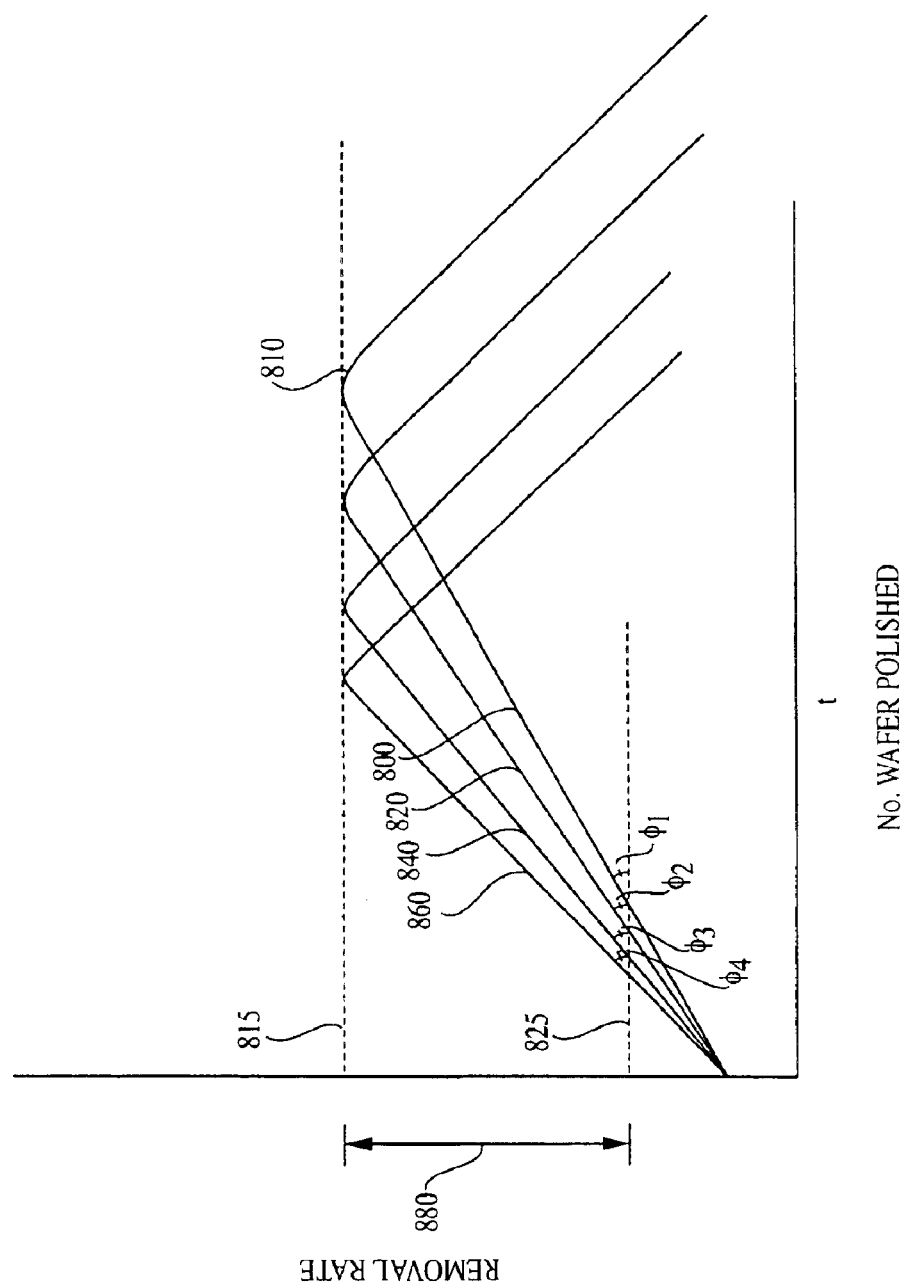
FIG. 8 is a model of polishing pad recovery based on FIGS. 3 and 4 used in predicting and optimizing the water removal rate in a CMP process.

As is described above with reference to FIGS. 3 and 4, once the equilibrium wafer material removal rate or the minimum acceptable material removal rate is reached, recovery is possible by reversing the direction of pad conditioning (see, FIG. 4C). With reference to FIG. 8, a curve is generated to illustrate the effect of direction of conditioning pad rotation on wafer removal rate (all other variables held constant). Curve 800 represents the increase in wafer material removal rate with time (as determined by number of wafers polished) for a given angular velocity as the flattening of the polishing pad surface is alleviated upon conditioning in the reverse direction. The removal rate is shown as increasing linearly with time until a saturation point 810 is achieved, which is typically less than the initial maximum removal rate of the pad. In at least some embodiments of the invention, the curve may be linear or non-linear, e.g. expotential or quadratic, or the like. Additional polishing results in loss of surface roughness due to orientation in the opposite direction, and so wafer material removal rates again are expected to decline. Thus, the maximum wafer material removal rate 815 is defined at the curve maximum. As above, an operating minimum wafer material removal rate 825 can be suggested by production goals, since a minimal wafer throughput rate is needed. The removal rate range 880 defines the removal rate maximum and minimum for the pad recovery model.

In at least some embodiments of the invention, successive curves 820, 840, 860 are also generated for different velocities of the conditioning disk. Each curve reaches a maximum, which represents the optimal recovery of the polishing pad due to reversal of the conditioning direction and then declines. The angles $\Phi_1$, $\Phi_2$, $\Phi_3$, and $\Phi_4$ are defined for each curve 800, 820, 840, 860, respectively. The value for $\Phi$ is descriptive of the recovery of the polishing pad. The larger the value for $\Phi$, the steeper the slope of the curve and the more sensitive the recovery process is to conditioning parameters. Since it is not possible to fully compensate for pad wear by reversing direction of conditioning, for a given sample curve conditioned at a given angular velocity, $\theta > \Phi$.

According to the above model, once the maximal recovery in wafer material removal rates is achieved, the wafer material removal rate will again decline and approach the minimum acceptable removal rate. The direction of the conditioning disk is again reversed and wafer material removal rates are expected to increase once again. The values for each successive maximum in the recovery curves of FIG. 8 are expected to decrease until performance above the minimum removal rate is not possible. At this point, the conditioning velocity is increased in order to bring the removal rate into the acceptable range. The model at the higher velocity is now used to predict future performance.

The results of these studies provide maximum and minimum wafer material removal rates, and performance at different conditioning velocities. In addition, values for constants $\theta_1$–$\theta_4$ and $\Phi_1$–$\Phi_4$ relating to curve slopes may be determined. Although the above designs of experiment show a conditioning parameter that demonstrates an increase in wafer removal rate with increase in magnitude of the parameter, it is understood that the opposite relationship can exist, so that the minimal parameter value produces the maximum wafer removal rate. The models can be adjusted accordingly. Maximum and minimum conditions may be determined for any combination of polishing pad, wafer and polishing slurry known in the art. Additional parameters, up to $x_n$, may be included in the model and their minimum and maximum values determined as indicated by steps 640 and 650.

The model can be represented as raw data that reflects the system, or it can be represented by equations, for example multiple input-multiple output linear, quadratic and non-linear equations, which describe the relationship among the variables of the system. Feedback and feed forward control algorithms are constructed in step 660 based on the above model using various methods. For example, the wafer removal rate may be defined as the weighted contribution of all the pad conditioning parameters, $x_1$ through $x_n$. The algorithms may be used to optimize conditioning parameters using various methods, such as recursive parameter estimation. Recursive parameter estimation is used in situations such as these, where it is desirable to model on line at the same time as the input-output data is received. Recursive parameter estimation is well-suited for making decisions on-line, such as adaptive control or adaptive predictions. For more details about the algorithms and theories of identification, see Ljung L., *System Identification—Theory for the User*, Prentice Hall, Upper Saddle River, N.J. 2nd edition, 1999.

In at least some embodiments of the present invention, the CMP pad life is a function of surface roughness and pad elasticity as shown in eq. 1:

$$\text{PadLife} = f(\text{surface roughness, elasticity}). \quad (1)$$

In at least some embodiments of the present invention, the wafer material removal rate is described according to eq. 2:

$$\text{RemovalRate}]_{\min}^{\max} = f(\omega_{disk}]_{\min}^{\max}, f]_{\min}^{\max}, t_{conditioning}]_{\min}^{\max}, \text{direction}, T_2]_{\min}^{\max}), \quad (2)$$

where $\omega_{disk}$ is the angular velocity (rotational speed, e.g., rpm) of the conditioning disk during conditioning of the polishing pad, direction is the direction of spin, i.e., clockwise or counterclockwise, of the conditioning disk, $T_2$ is the translational speed of the conditioning disk across the pad surface, as shown in the exemplary CMP device in FIG. 10 (which will be described in greater detail below), $t_{conditioning}$ is the duration of conditioning, and f is frequency of conditioning. Frequency is measured as the interval, e.g., number of wafers polished, between conditioning events and direction is defined above. For example, a frequency of 1 means that the pad is conditioned after every wafer, while a frequency of 3 means that the pad is conditioned after every third wafer. The sweeping speed is the speed at which the conditioning disk moves across the surface of the polishing pad. The motion is indicated by arrow $T_2$ in FIG. 10. For the purposes of initial investigation, it is assumed in at least some embodiments of the present invention that t (time), $T_2$ (sweep speed), and f (frequency) are held constant.

The objective function is to maintain removal rates within the minimum and maximum allowable rates (the "acceptable rates") by controlling the conditioning disk speed and direction, and, optionally, by controlling other factors such as frequency and duration of conditioning, conditioning disk down force, speed of translation of the conditioning disk across the pad surface. Each of the conditioning parameters is maintained within their determined boundary conditions, i.e., minimum and maximum values, as well.

Figure 9:
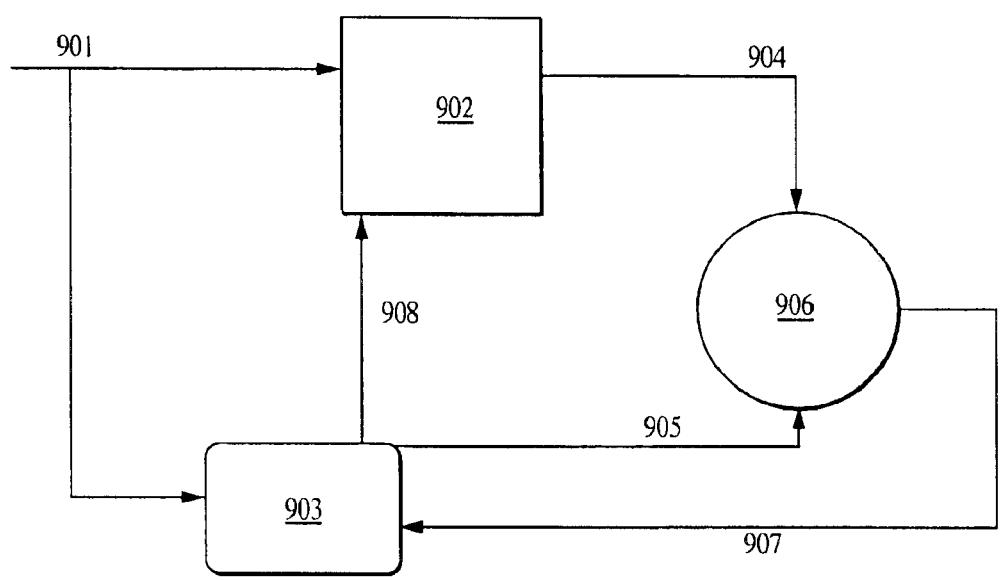
FIG. 9 is a model based on FIGS. 5 and 6 for predicting and modifying CMP operating parameters to optimize the wafer process.

The CMP parameters (variable) and constants from the model may then be programmed into a computer, which may then constantly monitor and appropriately vary the parameters during the process to improve the wafer material removal rate and the pad life, as shown in FIG. 9. Parameters from the base study 901 are input into the computer or other controller 902, which runs the wafer polishing process, and the estimator 903, which monitors and modifies the process parameters. The actual output (i.e., measured removal rate) 904 is monitored and compared to the predicted output (i.e., target removal rate) 905 calculated by estimator 903. The difference 906 between the actual output 904 and the predicted output 905 is determined and reported 907 to the estimator 903, which then appropriately generates updated parameters 908 for the process 902.

Updating model parameters for feedback control is based on eq. 3.

$$k = (k_1) + g*(k - (k_1)), \quad (3)$$

where k is a current parameter, $k_1$ is a previous parameter estimate, g is the estimate gain and $(k-(k_1))$ is the prediction error. Estimate gain is a constant selected by the user, which is used as a measure of machine error or variability. Gain factor may be determined empirically or by using statistical methods. In at least some embodiments, the gain is in the range of about 0.5 to 1.0, or in at least some embodiments, in the range of about 0.7 to 0.9.

By way of example, a series of curves may be generated for a polishing system of interest as described above for determining the relationship between wafer material removal rate and conditioning disk rotational velocity and direction. Curves are generated using a standard polishing procedure, with all operating conditions held constant with the exception of the parameter(s) under investigation. Exemplary polishing pad and wafer parameters that are held constant include polishing pad size, polishing pad composition, wafer composition, polishing time, polishing force, rotational velocity of the polishing pad, and rotational velocity of the wafer. The variable parameters include at least the angular speed and direction of the conditioning disk; however, additional parameters may be included in the model. Using the model such as shown in FIG. 6 for at least some of the embodiments of the invention, and the curves generated as in FIGS. 7 and 8, values for $\theta_1$–$\theta_4$, $\Phi_1$–$\Phi_4$, minimum and maximum values for wafer material removal rate, conditioning down force and conditioning disk rotational velocity are determined. An algorithm that models the wafer planarization is defined, and a first set of pad conditioning parameters may be determined for a polishing system of interest, either empirically or using historical data or data from the DOE.

An algorithm which models the pad wear and pad recovery process is input into the estimator and a predicted wafer material removal rate is calculated based upon the model. The actual results are compared against the predicted results and the error of prediction is fed back into the estimator to refine the model. New conditioning parameters are then determined. Based upon the models described herein, these parameters are just sufficient to revitalize the pad surface without overconditioning. Thus, the smallest increment in conditioning parameters that meet the model criteria is selected for the updated conditioning parameters. Subsequent evaluation of the updated model will determine how good is the fit, and further modifications can be made, if necessary, until the process is optimized.

In at least some embodiments of the present invention, the conditioning parameters are updated in discrete increments or steps, defined by way of example, by the incremental curves shown in FIGS. 7 and 8. A suitable number of curves are generated so that steps are small enough to permit minor adjustments to the conditioning parameters.

Also, in at least some embodiments of the present invention, the updated conditioning parameters may be determined by interpolation to the appropriate parameters, which may lie between curves. Interpolation may be appropriate in those instances where a fewer number of curves are initially generated and the experimental results do not provide a fine resolution of the parameters.

While deviations from the predicted rate reflects, in part, the inability of the model to account for all factors contributing to the process (this may be improved with subsequent iterations of the feedback process), deviations from the predicted wafer material removal rate over time represent a degradation in CMP pad polishing. By identifying and modifying the pad conditioning process to account for these changes in polishing capabilities, optimal wafer material removal rates are maintained without overconditioning of the condition pads, e.g., operating above the saturation point of the system.

An additional feature of the method is the use of gain factor to qualify the prediction error, as shown in eq. 3. Thus, the method suggests that the model need not correct for 100% of the deviation from predicted value. A gain factor may be used to reflect uncertainty in the measured or calculated parameters, or to "damp" the effect of changing parameters too quickly or to a too great an extent. It is possible, for example, for the model to overcompensate for the prediction error, thereby necessitating another adjustment to react to the overcompensation. This leads to an optimization process that is jumpy and takes several iterations before the optimized conditions are realized. Use of a gain factor in updating the parameters for feedback control qualifies the extent to which the model will react to the prediction error.

Once the basic system is understood and optimized, it is possible to empirically vary other conditioning operating parameters and access their impact on pad conditioning and wafer polishing. For example, conditioning down force, which may be set to a constant value in the initial study, may be increased (or decreased). The system is monitored to determine the effect this change had on the system. It should be readily apparent that other factors relevant to pad wear and conditioning may be evaluated in this manner. By way of example, conditioning time (residence time of the disk on the pad), conditioning disk translational speed, conditioning down force, and the like may be investigated in this manner. In addition, the model may be modified to include additional parameters in the model.

It is envisioned that at least some embodiments of the present invention may be practiced using a device 1000 such as the one shown in FIG. 10. The apparatus has a conditioning system 1010 including a carrier assembly 1020, a conditioning disk 1030 attached to the carrier assembly, and a controller 1040 operatively coupled to the carrier assembly to control the down force (F) and rotation rate ($\omega$) of the conditioning disk. The carrier assembly may have an arm 1050 to which the conditioning disk 1030 is attached and means 1060a–d to move the conditioning disk in and out of contact with the planarizing surface. For example, the controller 1040 may be operatively coupled to the moving means to adjust the height and position of the arm carrying the conditioning disk (1060a, 1060b, 1060c, 1060d). Similar controls for control of the position and movement of the wafer may also be present. In operation, the controller adjusts the operating parameters of the conditioning disk, e.g., down force and rotation rate, in response to changes in wafer material removal rate. The controller may be computer controlled to automatically provide conditioning according to the calculated conditioning recipe. Thus, the apparatus provides a means for selectively varying the pad conditioning parameters over the operating life of the pad 1080 in order to extend pad life without compromise to the planarization process of the wafer 1090. Other types of devices where, e.g., other components have their height, positions, and/or rotations adjusted are also contemplated by at least some embodiments of the present invention.

Additional apparatus utilized to implement the feedforward and feedback loop include a film thickness measurement tool to provide thickness data needed to calculate wafer material removal rate. The tool may be positioned on the polishing apparatus so as to provide in-line, in situ measurements, or it may be located remote from the polishing apparatus. The tool may use optical, electrical, acoustic or mechanical measurement methods. A suitable thickness measurement device is available from Nanometrics (Milpitas, Calif.) or Nova Measuring Instruments (Phoenix, Ariz.). A computer may be utilized to calculate the optimal pad conditioning recipe based upon the measured film thickness and calculated removal rate, employing the models and algorithm provided according to the invention. A suitable integrated controller and polishing apparatus (Mirra with iAPC or Mirra Mesa with iAPC) is available from Applied Materials, California.

Exemplary semiconductor wafers that can be polished using the concepts discussed herein including, but are not limited to those made of silicon, tungsten, aluminum, copper, BPSG, USG, thermal oxide, silicon-related films, and low k dielectrics and mixtures thereof.

The invention may be practiced using any number of different types of conventional CMP polishing pads. There are numerous CMP polishing pads in the art which are generally made of urethane or other polymers. However, any pad that can be reconditioned can be evaluated and optimized using the method of the invention. Exemplary polishing pads include Epic™ polishing pads (Cabot Microelectronics Corporation, Aurora Ill.) and Rodel® IC1000, IC1010, IC1400 polishing pads (Rodel Corporation, Newark, Del.), OXP series polishing pads (Sycamore Pad), Thomas West Pad 711, 813, 815, 815-Ultra, 817, 826, 828, 828-E1 (Thomas West).

Furthermore, any number of different types of slurry can be used in the methods of the invention. There are numerous CMP polishing slurries in the art, which are generally made to polish specific types of metals in semiconductor wafers. Exemplary slurries include Semi-Sperse® (available as Semi-Sperse® 12, Semi-Sperse® 25, Semi-Sperse® D7000, Semi-Sperse® D7100, Semi-Sperse® D7300, Semi-Sperse® P1000, Semi-Sperse® W2000, and Semi-Sperse® W2585) (Cabot Microelectronics Corporation, Aurora Ill.), Rodel ILD1300, Klebesol series, Elexsol, MSW1500, MSW2000 series, CUS series and PTS (Rodel).

In at least some embodiments, the method of the invention can be used to predict pad life for tool scheduling. For example, if the number of wafers, after each condition cycle decreases, one could predict a pad life end point and use that prediction to schedule retooling.

The present invention is described above under conditions where wafer polishing parameters are held constant. However, in at least some embodiments of the invention, the methodology can also be used together with an optimization engine when the wafer polishing parameters are changing through an optimization engine.

In at least some embodiments, pad conditioning optimization may be carried out together with optimization of wafer polishing. This can be accomplished through optimization by having the optimization search engine's objective function minimize a function that describes both polishing and conditioning parameters.

Assuming n number of polishing parameters to be changed during the wafer polishing, N1, N2, N3 . . . Nn, and y number of control parameters, Y1,Y2,. Yy, then $$S = W_{N1}(N1_{previous} - N1_{current})^2 + W_{N2}(N2_{previous} - N2_{current})^2$$

$$+ \ldots W_{Nn}(Nn_{previous} - Nn_{current})^2 + W_{\omega}(\omega_{previous} - \omega_{current})^2$$

$$+ W_d(d_{previous} - d_{current})^2 + W_{Y1}(Y1_{previous} -$$

$$Y1_{current})_2 + W_{Y2}(Y2_{previous} - Y2_{current})^2$$

$$+ W_{Yy}(Yy_{previous} - Yy_{current})^2,$$

where $W_x$ is a weighing factor for parameter x (e.g., N1, N2, Y1, Y1, F, etc.), $\omega$ is the pad rotational velocity, and d is the conditioning pad direction of spin. Other pad conditioning parameters can be included in the function. The optimization process then seeks to minimize S. Thus, the method of the present invention can be used under conditions when the polishing parameters are held constant or when the polishing parameters are to be changed through optimization.

Figure 11:
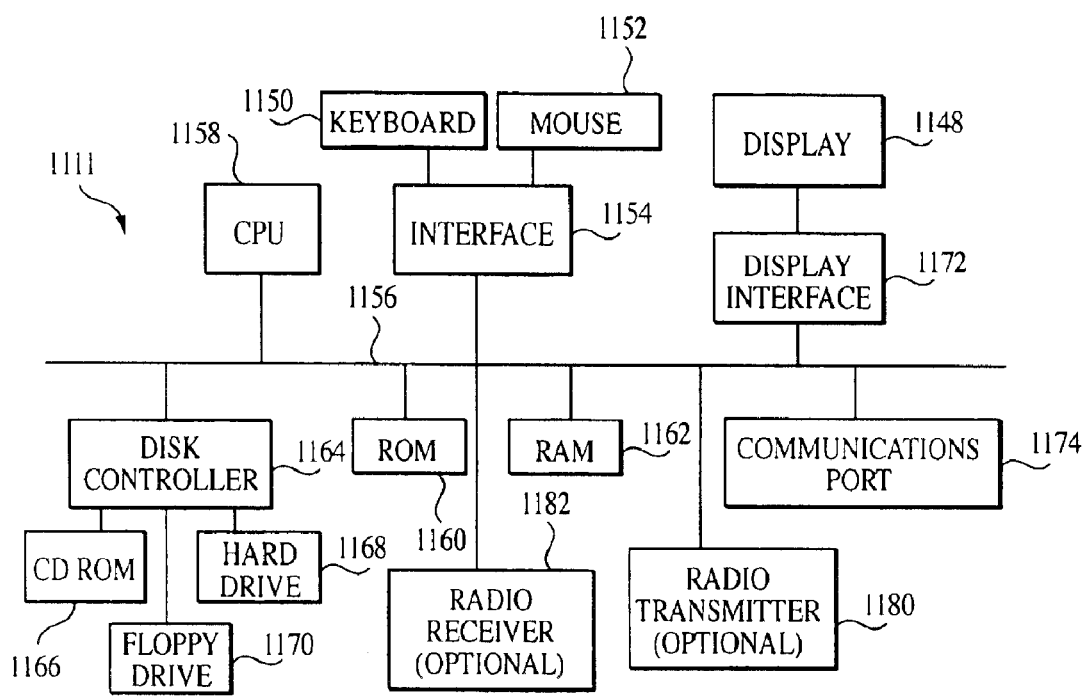
FIG. 11 is a block diagram of a computer system that includes tool representation and access control for use in at least some embodiments of the invention.

Various aspects of the present invention that can be controlled by a computer, including computer or other controller 902, can be (and/or be controlled by) any number of control/computer entities, including the one shown in FIG. 11. Referring to FIG. 11 a bus 1156 serves as the main information highway interconnecting the other components of system 1111. CPU 1158 is the central processing unit of the system, performing calculations and logic operations required to execute the processes of embodiments of the present invention as well as other programs. Read only memory (ROM) 1160 and random access memory (RAM) 1162 constitute the main memory of the system. Disk controller 1164 interfaces one or more disk drives to the system bus 1156. These disk drives are, for example, floppy disk drives 1170, or CD ROM or DVD (digital video disks) drives 1166, or internal or external hard drives 1168. These various disk drives and disk controllers are optional devices.

A display interface 1172 interfaces display 1148 and permits information from the bus 1156 to be displayed on display 1148. Display 1148 can be used in displaying a graphical user interface. Communications with external devices such as the other components of the system described above can occur utilizing, for example, communication port 1174. Optical fibers and/or electrical cables and/or conductors and/or optical communication (e.g., infrared, and the like) and/or wireless communication (e.g., radio frequency (RF), and the like) can be used as the transport medium between the external devices and communication port 1174. Peripheral interface 1154 interfaces the keyboard 1150 and mouse 1152, permitting input data to be transmitted to bus 1156. In addition to these components, system 1111 also optionally includes an infrared transmitter and/or infrared receiver. Infrared transmitters are optionally utilized when the computer system is used in conjunction with one or more of the processing components/stations that transmits/receives data via infrared signal transmission. Instead of utilizing an infrared transmitter or infrared receiver, the computer system may also optionally use a low power radio transmitter 1180 and/or a low power radio receiver 1182. The low power radio transmitter transmits the signal for reception by components of the production process, and receives signals from the components via the low power radio receiver. The low power radio transmitter and/or receiver are standard devices in industry.

Although system 1111 in FIG. 11 is illustrated having a single processor, a single hard disk drive and a single local memory, system 1111 is optionally suitably equipped with any multitude or combination of processors or storage devices. For example, system 1111 may be replaced by, or combined with, any suitable processing system operative in accordance with the principles of embodiments of the present invention, including sophisticated calculators, and hand-held, laptop/notebook, mini, mainframe and super computers, as well as processing system network combinations of the same.

Figure 12:
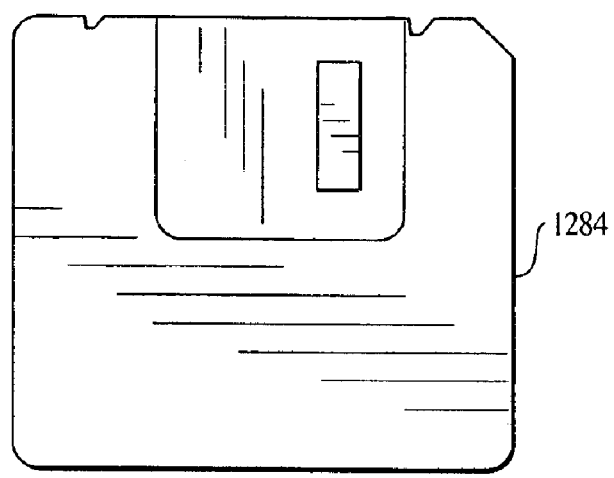
FIG. 12 is an illustration of a floppy disk that may store various portions of the software according to at least some embodiments of the invention.

FIG. 12 is an illustration of an exemplary computer readable memory medium 1284 utilizable for storing computer readable code or instructions. As one example, medium 1284 may be used with disk drives illustrated in FIG. 11. Typically, memory media such as floppy disks, or a CD ROM, or a digital video disk will contain, for example, a multi-byte locale for a single byte language and the program information for controlling the above system to enable the computer to perform the functions described herein. Alternatively, ROM 1160 and/or RAM 1162 illustrated in FIG. 11 can also be used to store the program information that is used to instruct the central processing unit 1158 to perform the operations associated with the instant processes. Other examples of suitable computer readable media for storing information include magnetic, electronic, or optical (including holographic) storage, some combination thereof, etc. In addition, at least some embodiments of the present invention contemplate that the medium can be in the form of a transmission (e.g., digital or propagated signals).

In general, it should be emphasized that the various components of embodiments of the present invention can be implemented in hardware, software or a combination thereof. In such embodiments, the various components and steps would be implemented in hardware and/or software to perform the functions of the present invention. Any presently available or future developed computer software language and/or hardware components can be employed in such embodiments of the present invention. For example, at least some of the functionality mentioned above could be implemented using the C, C++, or any assembly language appropriate in view of the processor(s) being used. It could also be written in an interpretive environment such as Java and transported to multiple destinations to various users.

Although various embodiments that incorporate the teachings of the present invention have been shown and described in detail herein, those skilled in the art can readily devise many other varied embodiments that incorporate these teachings.

What is claimed is:

1. A method of conditioning a planarizing surface in a chemical mechanical polishing (CMP) apparatus having a polishing pad against which a wafer is positioned for removal of material therefrom and a conditioning disk is positioned for conditioning of the polishing pad, comprising the steps of:
    a) providing a pad wear and conditioning model that defines wafer material removal rate as a function of at least one pad conditioning parameter selected from the group including rotation speed and rotation direction of a conditioning disk;
    b) polishing a wafer in a CMP apparatus under a first set of pad conditioning parameters selected to maintain wafer material removal rates within preselected minimum and maximum removal rates;
    c) determining a wafer material removal rate occurring during said polishing step; and
    d) calculating updated pad conditioning parameters based upon said determined wafer material removal rate of said step (c) and the pad wear and conditioning model of said step (a).

2. The method of claim 1, wherein step (d) includes calculating updated pad conditioning parameters to maintain wafer material removal rate within the maximum and minimum removal rates.

3. The method of claim 1, wherein the first set of pad conditioning parameters are determined empirically.

4. The method of claim 1, wherein the first set of pad conditioning parameters are determined using historical data.

5. The method of claim 1, wherein the first set of pad conditioning parameters are determined using the results of the design of experiment (DOE).

6. The method of claim 1, wherein the pad conditioning parameter of the pad wear and pad recovery model further comprises a conditioning parameter selected from the group consisting of frequency of conditioning, duration of conditioning, and translational speed of conditioning disk during conditioning.

7. The method of claim 1, wherein the updated pad conditioning parameters are calculated by determining the difference between an output of the pad wear and conditioning model and said determined wafer material removal rate of step (c).

8. The method of claim 7, wherein said difference is adjusted using an estimate gain prior to calculating updated conditioning parameters.

9. The method of claim 8, wherein the gain is selected to represent variability or reliability in the measured parameter.

10. The method of claim 1, wherein the updated pad conditioning parameters are updated according to the equation $k=(k_1)+g*(k-(k_1))$, where k is a measured wafer material removal rate, $k_1$ is a calculated wafer material removal rate, g is the estimate gain, and $(k-(k_1))$ is the prediction error.

11. The method of claim 1, wherein the steps (b) through (d) are repeated.

12. The method of claim 1, wherein the step of calculating updated pad conditioning parameters in step (d) comprises executing a recursive optimization process.

13. The method of claim 1, wherein the maximum value for wafer material removal rate is the saturation point of the wafer material removal rate vs. conditioning down force curve.

14. The method of claim 1, wherein the maximum value for wafer material removal rate is the initial rate.

15. The method of claim 1, wherein the minimum value for wafer material removal rate is defined by the maximum acceptable wafer polishing time.

16. The method of claim 1, wherein the wafer material removal rate is defined by the equation $$RemovalRate]_{min}^{max} = f(\omega_{disk}]_{min}^{max}, f]_{min}^{max}, t_{conditioning}]_{min}^{max}, \text{direction}, T_2]_{min}^{max}),$$

where $\omega_{disk}$ is the angular velocity of the conditioning disk during conditioning of the polishing pad, t is the time of conditioning, f is the frequency of condition, direction is the spinning direction of the conditioning disk, and $T_2$ is the sweeping speed of the conditioning disk during conditioning.

17. A method of developing a pad wear and pad conditioning model for optimization of the pad conditioning for polishing pads used to remove material from a wafer, comprising the steps of:
    a) determining the relationship between at least one pad conditioning parameter and wafer material removal rate; and
    b) determining maximum and minimum values for each of the at least one pad conditioning parameters and the wafer material removal rate; and
    c) recording the relationships and minimum and maximum values of the at least one pad conditioning parameter and the wafer removal rate.

18. The method of claim 17, wherein the at least one pad conditioning parameter comprises a plurality of parameters and the wafer removal rate is defined as a weighted function of the plurality of pad conditioning parameters.

19. The method of claim 17, wherein the at least one pad conditioning parameter comprises conditioning disk rotational speed.

20. The method of claim 19, wherein the at least one pad conditioning parameter further comprises conditioning disk rotational direction.

21. The method of claim 17, where the at least one pad conditioning parameter comprises one or more parameters selected from the group consisting of conditioning disk down force, conditioning disk rotational rate and direction, frequency and duration of conditioning and conditioning disk translational speed.

22. The method of claim 17, wherein the relationship between the at least one conditioning parameter and wafer removal rate is determined by incrementally varying the conditioning parameter and measuring the resultant wafer removal rate.

23. The method of claim 17, wherein the maximum value for the conditioning parameter is the value above which no incremental increase of the wafer removal rate is observed.

24. The method of claim 17, wherein the minimum value for the conditioning parameter is the value that provides the minimum wafer removal rate.

25. The method of claim 17, further comprising:

polishing a wafer in a chemical mechanical polishing (CMP) apparatus under a first set of pad conditioning parameters selected to maintain wafer material removal rates within preselected minimum and maximum removal rates including conditioning disk rotational speed and direction;

determining a wafer material removal rate occurring during said polishing step; and calculating updated pad conditioning parameters based upon said determined wafer material removal rate and the pad wear and conditioning model to maintain wafer material removal rates within the maximum and minimum removal rates.

26. The method of claim 25, wherein the updated pad conditioning parameters are calculated by determining the difference between an output of the pad wear and conditioning model and said determined wafer material removal.

27. The method of claim 25, wherein the updated pad conditioning parameters are updated according to the equation $k=(k_1)+g*(k-(k_1))$, where k is a measured wafer material removal rate, $k_1$ is a calculated wafer material removal rate, g is the estimate gain, and $(k-(k_1))$ is the prediction error.

28. A method of conditioning a planarizing surface in a chemical mechanical polishing (CMP) apparatus having a polishing pad against which a wafer is positioned for removal of material therefrom and a conditioning disk is positioned for conditioning of the polishing pad, comprising the steps of:

(a) developing a pad wear and pad conditioning model that defines wafer material removal rate as a function of pad conditioning parameters by:

(i) determining the relationship between at least one pad conditioning parameter and wafer material removal rate; and (ii) determining maximum and minimum values for each of the at least one pad conditioning parameters and the wafer material removal rate; and (iii) recording the relationships and minimum and maximum values of the at least one pad conditioning parameter and the wafer removal rate;

(b) polishing a wafer in the CMP apparatus under a first set of pad conditioning parameters including conditioning disk rotational speed and direction, selected to maintain wafer material removal rates within preselected minimum and maximum removal rates;

(c) determining a wafer material removal rate occurring during said polishing step; and (d) calculating updated pad conditioning parameters based upon said determined wafer material removal rate of said step (b) and the pad wear and conditioning model to maintain wafer material removal rates within the maximum and minimum removal rates.

29. A method of conditioning a planarizing surface in a chemical mechanical polishing (CMP) apparatus having a polishing pad against which a wafer is positioned for removal of material therefrom and a conditioning disk is positioned for conditioning of the polishing pad, comprising the steps of:

a) providing a pad wear and conditioning model that defines wafer material removal rate as a function of at least one pad conditioning parameter and that identifies a maximum and minimum value for each of the at least one pad conditioning parameter and the wafer removal rate;

b) polishing a wafer in the CMP apparatus under a first set of pad conditioning parameters selected to maintain wafer material removal rates within preselected minimum and maximum removal rates;

c) determining a wafer material removal rate occurring during said polishing step;

d) calculating updated pad conditioning parameters based upon said determined wafer material removal rate of said step (c) and the pad wear and conditioning model of said step (a) and e) conditioning the polishing pad using the updated conditioning parameters.

30. The method of claim 1, wherein the polishing pads is conditioned during polishing of a wafer.

31. The method of claim 1, wherein the polishing pad is conditioned between between wafer polishing.

32. The method of claim 1, further comprising conditioning the polishing pad using the updated conditioning parameters.

* * * * *